(12) United States Patent
Kurihara

(10) Patent No.: US 12,412,859 B2
(45) Date of Patent: Sep. 9, 2025

(54) VIA WIRING FORMATION SUBSTRATE, MANUFACTURING METHOD FOR VIA WIRING FORMATION SUBSTRATE, AND SEMICONDUCTOR DEVICE MOUNTING COMPONENT

(71) Applicant: SAN-EI KAGAKU CO., LTD., Tokyo (JP)

(72) Inventor: Hiroyuki Kurihara, Tokyo (JP)

(73) Assignee: SAN-EI KAGAKU CO., LTD., Tokyo (JP)

( * ) Notice: Subject to any disclaimer, the term of this patent is extended or adjusted under 35 U.S.C. 154(b) by 933 days.

(21) Appl. No.: 17/294,285

(22) PCT Filed: Nov. 15, 2019

(86) PCT No.: PCT/JP2019/044922
§ 371 (c)(1),
(2) Date: May 14, 2021

(87) PCT Pub. No.: WO2020/101022
PCT Pub. Date: May 22, 2020

(65) Prior Publication Data
US 2021/0407950 A1    Dec. 30, 2021

(30) Foreign Application Priority Data

Nov. 15, 2018 (JP) ................................ 2018-215049
Nov. 15, 2018 (JP) ................................ 2018-215050
Sep. 10, 2019 (JP) ................................ 2019-164926

(51) Int. Cl.
*H01L 23/00* (2006.01)
*H01L 23/522* (2006.01)
*H01L 23/532* (2006.01)

(52) U.S. Cl.
CPC .......... *H01L 24/19* (2013.01); *H01L 23/5226* (2013.01); *H01L 23/53295* (2013.01);
(Continued)

(58) Field of Classification Search
CPC ................. H01L 24/19; H01L 23/5226; H01L 23/53295; H01L 24/24; H01L 2224/2402;
(Continued)

(56) References Cited

U.S. PATENT DOCUMENTS

| 5,353,498 A | 10/1994 | Fillion |
| 5,870,289 A | 2/1999 | Tokuda |

(Continued)

FOREIGN PATENT DOCUMENTS

| DE | 197 05 003 A1 | 11/1997 |
| DE | 694 30 765 T2 | 7/2002 |

(Continued)

OTHER PUBLICATIONS

International Search Report for PCT/JP2019/044922 dated Feb. 18, 2020, 5 pages.

(Continued)

*Primary Examiner* — Fernando L Toledo
*Assistant Examiner* — Neil R Prasad
(74) *Attorney, Agent, or Firm* — NIXON & VANDERHYE

(57) ABSTRACT

A via wiring formation substrate for mounting at least one semiconductor chip, the substrate including a support substrate, a releasable adhesive layer provided on the support substrate, a first insulating layer provided on the releasable adhesive layer, and a second insulating layer laminated on the first insulating layer, wherein the first insulating layer and the second insulating layer are provided with a via wiring formation via, the via wiring formation via enabling formation of via wirings which respectively correspond to a (Continued)

plurality of connection terminals of the semiconductor chip and which respectively connect the plurality of connection terminals, such that the via wiring formation via penetrates only through the first insulating layer and the second insulating layer without misalignment.

21 Claims, 31 Drawing Sheets

(52) U.S. Cl.
CPC ...... *H01L 24/24* (2013.01); *H01L 2224/2402* (2013.01); *H01L 2224/24225* (2013.01); *H01L 2224/245* (2013.01); *H01L 2924/0665* (2013.01); *H01L 2924/15747* (2013.01)

(58) Field of Classification Search
CPC ..... H01L 2224/24225; H01L 2224/245; H01L 2924/0665; H01L 2924/15747
See application file for complete search history.

(56) References Cited

U.S. PATENT DOCUMENTS

| | | | |
|---|---|---|---|
| 10,163,858 B1* | 12/2018 | Liu | H01L 24/82 |
| 2012/0319254 A1* | 12/2012 | Kikuchi | H05K 1/186 |
| | | | 257/659 |
| 2014/0085846 A1 | 3/2014 | Ma | |
| 2016/0205778 A1* | 7/2016 | Lin | H05K 3/4038 |
| | | | 29/829 |
| 2018/0054890 A1* | 2/2018 | Ishihara | H05K 3/06 |
| 2018/0138089 A1 | 5/2018 | Yu et al. | |

FOREIGN PATENT DOCUMENTS

| | | |
|---|---|---|
| JP | 7-7134 | 1/1995 |
| JP | 2007-53379 | 3/2007 |
| JP | 2010-118589 | 5/2010 |
| JP | 2013-58520 | 3/2013 |
| JP | 2015-226013 | 12/2015 |

OTHER PUBLICATIONS

Written Opinion of the ISA for PCT/JP2019/044922 dated Feb. 18, 2020, 5 pages.
Office Action, issued in German Patent Application No. 112019005240.3 dated Feb. 23, 2024.

* cited by examiner (a)

(b)

(a)

(b)

(a)

(b)

(a)

(b)

(a)

(b)

b-b'

(a)

(b)

b-b'

(a)

(b)

b-b'

(c)

c-c'

(a)

(b)

b-b'

(c)

c-c'

(a)

(b)

VIA WIRING FORMATION SUBSTRATE, MANUFACTURING METHOD FOR VIA WIRING FORMATION SUBSTRATE, AND SEMICONDUCTOR DEVICE MOUNTING COMPONENT

This application is the U.S. national phase of International Application No. PCT/JP2019/044922 filed Nov. 15, 2019 which designated the U.S. and claims priority to Japanese Patent Application Nos. 2018-215049 filed Nov. 15, 2018, 2018-215050 filed Nov. 15, 2018, and 2019-164926 filed Sep. 10, 2019, the entire contents of each of which are hereby incorporated by reference.

TECHNICAL FIELD

The present invention relates to a via wiring formation substrate, to a method for producing a via wiring formation substrate (hereinafter may be referred to as a "via wiring formation substrate production method"), and to a semiconductor device-mounted component product.

BACKGROUND ART

In the fields of mobile terminals and information appliances, a multilayer substrate structure incorporating semiconductor chips has been an essential element for meeting the needs of reduction in size and weight, up-grading of functions, higher communication speed, and adaptation to high frequency. One technique for realizing such a multilayer substrate structure incorporating semiconductor chips is a fan-out wafer-level package (FO-WLP), in which a re-wiring layer is formed outside the semiconductor chip area so as to achieve high wiring density. FO-WLP is a technical mode currently attracting attention in the art.

For fabricating FO-WLPs, a chip-first technique has been proposed. In this technique, semiconductor chips cut out from a wafer are arranged with intervals to form an assembly (hereinafter referred to as a "pseudo-wafer"). Then, a re-wiring layer is formed on the pseudo-wafer, and the re-wiring layer-formed pseudo-wafer is cut into individual packages (see Patent Document 1).

Also, one mode of mass production of FO-WLPs is a technique called integrated fan-out (InFO) (see Patent Document 2). In this technique, an interconnect wiring layer 104 is provided on a support substrate 102, and columnar electrical connectors 108 are provided on the interconnect wiring layer 104 (FIG. 1B). On the interconnect wiring layer 104 between the electrical connectors 108, a first semiconductor chip 110 having electrical connectors 112 is disposed, with the active surface being opposite the backside surface (FIG. 1C). The electrical connectors 108 and the semiconductor chip 110 are encapsulated with a molding material 114, and the material is cured (FIG. 1D). The molding material 114 is ground so that the top surfaces 108A of the electrical connectors 108 and the top surfaces 112A of the electrical connectors 112 of the semiconductor chip 110 are exposed, to thereby form through molding vias from the electrical connectors 108 and 112 (FIG. 1E). Subsequently, an interconnect wiring layer (a re-wiring layer) 116 is provided so as to connect to the through molding vias made from the electrical connectors 108 and 112, and electrical connectors 118 are formed on the re-wiring layer (FIG. 1F). On the electrical connectors 118, a second semiconductor chip 120 is mounted (FIG. 1G).

In the above technique, the columnar electrical connectors 108 and electrical connectors 112 on the semiconductor chip 110 are simultaneously molded, and the connectors are exposed by grinding the top surfaces thereof. Therefore, as the wiring density increases, difficulty is encountered in grinding and in connecting to the re-wiring layer. In addition, since the maximum allowable height of each of the columnar electrical connectors 108 is about 150 to 200 μm, difficulty may also be encountered in the process for producing tall semiconductor chips 110. Furthermore, in the case where a plurality of semiconductor chips are mounted at a first stage, when the heights of the semiconductor chips vary, electrical connectors to a certain semiconductor chip must be formed in a columnar shape, and other modifications are required. Such countermeasures are problematically cumbersome.

PRIOR ART DOCUMENTS

Patent Documents

Patent Document 1: Japanese Patent Application Laid-Open (kokai) No. 2013-58520
Patent Document 2: U.S. Patent Application 2018/0138089

SUMMARY OF THE INVENTION

Problems to be Solved by the Invention

Thus, an object of the present invention for solving the aforementioned problems is to provide a via wiring formation substrate which can achieve simultaneous mounting of semiconductor chips having various heights without advance provision of columnar electrical connectors. Another object is to provide a production method therefor. Still another object is to provide a semiconductor device-mounted component product fabricated by use of the via wiring formation substrate.

Means for Solving the Problems

In a first mode of the present invention to attain the aforementioned objects, there is provided a via wiring formation substrate for mounting at least one semiconductor chip, the substrate comprising a support substrate, a releasable adhesive layer provided on the support substrate, a first insulating layer provided on the releasable adhesive layer, and a second insulating layer laminated on the first insulating layer, characterized in that the first insulating layer and the second insulating layer are provided with a via wiring formation via, the via wiring formation via enabling formation of via wirings which respectively correspond to a plurality of connection terminals of the semiconductor chip and which respectively connect the plurality of connection terminals, such that the via wiring formation via penetrates only through the first insulating layer and the second insulating layer without misalignment.

A second mode of the present invention is drawn to a specific embodiment of the via wiring formation substrate of the first mode, wherein the second insulating layer is formed of a low-flowability adhesive.

A third mode of the present invention is drawn to a specific embodiment of the via wiring formation substrate of the first or second mode, wherein the first insulating layer is formed of an epoxy sealing material.

In a fourth mode of the present invention, there is provided a method for producing a via wiring formation substrate, characterized in that the method comprises a step of providing a laminated substrate having a first support substrate, and, laminated on the substrate, a first releasable adhesive layer formed thereon, a first metal layer formed thereon, and a second metal layer formed thereon, the second metal layer having an etching characteristic different from that of the first metal layer;

a step of providing a resist layer on the second metal layer and providing a plurality of first via formation holes in the resist layer through a predetermined pattern; a step of providing, in the second metal layer, second via formation holes communicating with the first via formation holes, through the first via formation holes of the resist layer by the mediation of the first metal layer serving as an etching stop layer; a step of embedding the first via formation holes and the second via formation holes with a third metal, the third metal having an etching characteristic different from that of the second metal layer, to thereby form third metal columns; a step of releasing the resist layer; a step of forming, on the second metal layer, a first insulating layer in which the third metal columns are embedded; a step of grinding the surface of the first insulating layer, to thereby expose first end surfaces of the third metal columns; a step of bonding a second support substrate onto the first insulating layer and the third metal columns by the mediation of a second releasable adhesive layer; a step of releasing the first releasable adhesive layer and the first support substrate; a step of removing the first metal layer, to thereby expose the first metal layer and second end surfaces of the third metal columns, the second end surfaces being opposite the first end surfaces; step of removing the first metal layer through etching by the mediation of an etching stop layer formed of the third metal columns and the first insulating layer; a step of providing a second insulating layer on the first insulating layer and embedding the third metal columns in the second insulating layer; a step of grinding the surface of the second insulating layer, to thereby expose the second end surfaces of the third metal columns; and a step of removing the third metal columns through etching by the mediation of the first insulating layer and the second insulating layer as etching stop layers, to thereby provide via wiring formation vias.

A fifth mode of the present invention is drawn to a specific embodiment of the via wiring formation substrate production method of the fourth mode, wherein the second insulating layer is formed of a low-flowability adhesive.

A sixth mode of the present invention is drawn to a specific embodiment of the via wiring formation substrate production method of the fourth or fifth mode, wherein the first insulating layer is formed of an epoxy sealing material.

A seventh mode of the present invention is drawn to a specific embodiment of the via wiring formation substrate production method of any of the fourth to sixth modes, wherein the first metal layer is formed of nickel or a nickel alloy, and the second metal layer is formed of copper or a copper alloy.

An eighth mode of the present invention is drawn to a specific embodiment of the via wiring formation substrate production method of any of the fourth to seventh modes, wherein the third metal columns are formed of nickel or a nickel alloy.

In a ninth mode of the present invention, there is provided a method for producing a semiconductor device-mounted component product, characterized in that the method comprises a step of providing a via wiring formation substrate as recited in any of the first to third modes or a via wiring formation substrate produced through a via wiring formation substrate production method as recited in any of the fourth to eighth modes; a step of providing a semiconductor chip having copper terminals as connection terminals and joining the semiconductor chip onto the second insulating layer of the via wiring formation substrate by the mediation of an adhesive or onto the second insulating layer of the via wiring formation substrate, which layer is formed of the low-flowability adhesive, while the copper terminals oppositely face the via wiring formation vias of the via wiring formation substrate; a step of forming a third insulating layer in which the semiconductor chip is embedded; a step of releasing the releasable adhesive layer and the support substrate, or releasing the second releasable adhesive layer and the second support substrate; and a step of embedding the via wiring formation vias with copper from the side opposite the semiconductor chip-provided side of the via wiring formation vias, to thereby form via wirings connected to the copper terminals.

In a tenth mode of the present invention, there is provided a semiconductor device-mounted component product characterized by comprising a component-receiving laminate which includes a first layer formed of a first insulating layer and a second layer laminated on the first layer, wherein the first layer and the second layer are provided with via wiring formation vias such that the vias penetrate only through the first and second layers without misalignment; at least one component which is bonded to the first layer or the second layer of the component-receiving laminate and which has connection terminals oppositely facing the via wiring formation vias; a third layer which is formed of a mold resin and in which the component is embedded; and via wirings in which one ends are connected to the connection terminals of the component and the other ends are extracted to the opposite side of the component-receiving laminate through the via wiring formation vias; wherein the total thickness of the first layer and the second layer of the component-receiving laminate is selected from a range of 15 µm to 70 µm.

An eleventh mode of the present invention is drawn to a specific embodiment of the semiconductor device-mounted component product of the tenth mode, wherein the first insulating layer of the first layer is formed of an epoxy sealing material.

A twelfth mode of the present invention is drawn to a specific embodiment of the semiconductor device-mounted component product of the tenth or eleventh mode, wherein the component comprises at least one semiconductor chip having connection terminals, and at least one semiconductor chip or passive component having a height, or a size in the thickness direction different from that of the semiconductor chip and that of the component-receiving laminate.

A thirteenth mode of the present invention is drawn to a specific embodiment of the semiconductor device-mounted component product of any of the tenth to twelfth modes, wherein the second layer is formed of a second insulating layer, and the component is bonded to the second layer.

A fourteenth mode of the present invention is drawn to a specific embodiment of the semiconductor device-mounted component product of the thirteenth mode, wherein the via wirings are extracted from the connection terminals of the component to the opposite side of the component-receiving laminate through through holes provided in insulating layers for re-wiring provided in the via wiring formation vias.

A fifteenth mode of the present invention is drawn to a specific embodiment of the semiconductor device-mounted component product of the thirteenth or fourteenth mode, wherein the second layer is formed of a low-flowability adhesive.

A sixteenth mode of the present invention is drawn to a specific embodiment of the semiconductor device-mounted component product of any of the tenth to twelfth modes, wherein the second layer is formed of a metal layer; the component is bonded to the first layer; the via wirings are extracted from the connection terminals of the component through through holes provided in insulating layers for re-wiring provided in the via wiring formation vias; second through holes are provided in the insulating layer for re-wiring and the first layer for exposing the metal layer; and second wirings connecting to the metal layer are provided in the second through holes.

A seventeenth mode of the present invention is drawn to a specific embodiment of the semiconductor device-mounted component product of the sixteenth mode, wherein the metal layer is a copper foil.

An eighteenth mode of the present invention is drawn to a specific embodiment of the semiconductor device-mounted component product of any of the tenth to seventeenth modes, wherein the connection terminals of the component are disposed in a one-by-one mode with respect to the via wiring formation vias; a photosensitive resin layer is formed for embedding the first via wirings provided through the via wiring formation vias; the photosensitive resin layer is provided with through holes which oppositely face the first via wirings; and a wiring layer is provided on the photosensitive resin layer, the wiring layer including second via wirings formed in the through holes connecting to the first via wirings.

A nineteenth mode of the present invention is drawn to a specific embodiment of the semiconductor device-mounted component product of any of the tenth to seventeenth modes, wherein a plurality of connection terminals of the component are disposed with respect to one of the via wiring formation vias; the photosensitive resin layer of the via wiring formation vias is provided with the plurality of through holes which oppositely face the plurality of connection terminals; and each through hole is provided with the via wirings.

A twentieth mode of the present invention is drawn to a specific embodiment of the semiconductor device-mounted component product of the nineteenth mode, wherein the component is an area pad-type semiconductor chip in which a plurality of connection terminals are disposed in a predetermined area at a central part; the via wiring formation vias are provided in a shape adapted to the predetermined area; the photosensitive resin layer is formed so as to embed the via wiring formation vias; the plurality of through holes oppositely facing the plurality of connection terminals are provided; and each through hole is provided with the via wirings.

A twenty-first mode of the present invention is drawn to a specific embodiment of the semiconductor device-mounted component product of the nineteenth mode, wherein the component is a peripheral pad-type semiconductor chip in which a plurality of connection terminals are disposed in a predetermined peripheral area surrounding a central part; the via wiring formation vias are provided in a shape adapted to the predetermined peripheral area surrounding the central part; the photosensitive resin layer is formed so as to embed the via wiring formation vias; the plurality of through holes oppositely facing the plurality of connection terminals are provided; and each through hole is provided with the via wirings.

A twenty-second mode of the present invention is drawn to a specific embodiment of the semiconductor device-mounted component product of any of the tenth to seventeenth modes, wherein the component product is provided with a re-wiring layer in which re-wirings are formed on the surface where the via wirings are extracted, by the mediation of the photosensitive resin layer.

A twenty-third mode of the present invention is drawn to a specific embodiment of the semiconductor device-mounted component product of the twenty-second mode, wherein three or more layers of the re-wiring layers are provided.

A twenty-fourth mode of the present invention is drawn to a specific embodiment of the semiconductor device-mounted component product of the twenty-second mode, wherein two or three layers of the re-wiring layers are provided; the component-receiving laminate is further provided thereon; and a re-wiring layer is further provided thereon.

A twenty-fifth mode of the present invention is drawn to a specific embodiment of the semiconductor device-mounted component product of the twenty-second mode, wherein the component further includes the component-receiving laminate on the top re-wiring layer.

A twenty-sixth mode of the present invention is drawn to a specific embodiment of the semiconductor device-mounted component product of any of the nineteenth to twenty-second modes, wherein the component has an eWLP structure in which a semiconductor chip is provided with two or three layers of the re-wiring layers.

In a thirty-first mode of the present invention, there is provided a via wiring formation substrate for mounting at least one semiconductor chip, the substrate comprising a support substrate, a releasable adhesive layer provided on the support substrate, and an insulating layer provided on the releasable adhesive layer, characterized in that the insulating layer is provided with a via wiring formation via provided in the insulating layer, the via wiring formation via enabling formation of via wirings which respectively correspond to a plurality of connection terminals of the semiconductor chip and which respectively connect the plurality of connection terminals, such that the via wiring formation via penetrates only through the insulating layer without misalignment, and the via wiring formation via is a straight via having a diameter of 15 μm to 70 μm and has a positional accuracy of a photolithography level.

A thirty-second mode of the present invention is drawn to a specific embodiment of the via wiring formation substrate of the thirty-first mode, wherein the via wiring formation via is provided by removing metal columns or photosensitive resin columns embedded in the insulating layer, instead of by drilling or laser machining.

A thirty-third mode of the present invention is drawn to a specific embodiment of the via wiring formation substrate of the thirty-first or thirty-second mode, wherein the insulating layer is formed of an epoxy sealing material.

A thirty-fourth mode of the present invention is drawn to a specific embodiment of the via wiring formation substrate of any of the thirty-first to thirty-third modes, wherein a metal layer is disposed between the insulating layer and the releasable adhesive layer, and the via wiring formation vias are provided so as to penetrate through the metal layer.

A thirty-fifth mode of the present invention is drawn to a specific embodiment of the via wiring formation substrate of the thirty-fourth mode, wherein the metal layer disposed between the insulating layer and the releasable adhesive layer is formed of a first metal layer and a second metal layer, the two layers being stacked in this order from the releasable adhesive layer side.

A thirty-sixth mode of the present invention is drawn to a specific embodiment of the via wiring formation substrate of the thirty-fourth mode, wherein the metal layer and the metal columns are formed of nickel or a nickel alloy.

A thirty-seventh mode of the present invention is drawn to a specific embodiment of the via wiring formation substrate of the thirty-fifth mode, wherein the first metal layer and the metal columns are formed of nickel or a nickel alloy, and the second metal layer is formed of copper or a copper alloy.

In a thirty-eighth mode of the present invention, there is provided a method for producing a via wiring formation substrate, characterized in that the method comprises a step of providing a laminated substrate having a first support substrate, and, laminated on the substrate, a first releasable adhesive layer formed thereon and a metal layer formed thereon; a step of providing a resist layer on the metal layer and providing a plurality of via formation holes in the resist layer through a predetermined pattern; a step of embedding the via formation holes with a metal on the metal layer, to thereby form metal columns; a step of releasing the resist layer; a step of forming, on the metal layer, an insulating layer in which the metal columns are embedded; a step of grinding the surface of the insulating layer, to thereby expose first end surfaces of the metal columns; and a step of removing the metal columns through etching by the mediation of the insulating layer and the releasable adhesive layer as etching stop layers, to thereby provide via wiring formation vias.

A thirty-ninth mode of the present invention is drawn to a specific embodiment of the via wiring formation substrate production method of the thirty-eighth mode, wherein the method comprises, after the step of exposing the first end surfaces of the metal columns, a step of bonding a second support substrate on the insulating layer and the metal columns by the mediation of the second releasable adhesive layer; a step of releasing the releasable adhesive layer and the support substrate; and a step of removing the metal layer, to thereby expose second end surfaces of the metal columns, the second end surfaces being opposite the first end surfaces; and, subsequently, a step of removing the metal columns through etching, to thereby provide via wiring formation vias.

In a fortieth mode of the present invention, there is provided a method for producing a via wiring formation substrate, characterized in that the method comprises a step of providing a laminated substrate having a support substrate, and, sequentially laminated on the substrate, a releasable adhesive layer formed thereon, a first metal layer, and a second metal layer formed thereon; a step of providing a resist layer on the second metal layer and providing a plurality of via formation holes in the resist layer through a predetermined pattern; a step of etching only the second metal layer by the mediation of the predetermined pattern of the resist layer as a mask; a step of embedding the via formation holes with a metal on the first metal layer, to thereby form metal columns; a step of releasing the resist layer; a step of forming, on the first metal layer, an insulating layer in which the metal columns are embedded; a step of grinding the surface of the insulating layer, to thereby expose first end surfaces of the metal columns; and a step of removing the metal columns and the first metal layer through etching by the mediation of the insulating layer and the releasable adhesive layer as etching stop layers, to thereby provide via wiring formation vias.

In a forty-first mode of the present invention, there is provided a method for mounting a semiconductor chip, characterized in that the method comprises a step of providing a via wiring formation substrate as recited in any of the thirty-first to thirty-seventh modes or a via wiring formation substrate produced through a via wiring formation substrate production method as recited in any of the thirty-eighth to fortieth modes; a step of providing a semiconductor chip having copper terminals as connection terminals on the insulating layer of the via wiring formation substrate and joining the semiconductor chip onto the insulating layer by the mediation of an adhesive, while the copper terminals oppositely face the via wiring formation vias of the via wiring formation substrate; a step of forming an embedding insulating layer in which the semiconductor chip is embedded; a step of releasing the releasable adhesive layer and the support substrate, or releasing the second releasable adhesive layer and the second support substrate; and a step of embedding the via wiring formation vias with copper from the side opposite the semiconductor chip-provided side, to thereby form via wirings connected to the copper terminals.

In a forty-second mode of the present invention, there is provided a method for mounting a semiconductor chip, characterized in that the method comprises a step of providing a via wiring formation substrate as recited in the thirty-fourth or thirty-sixth mode or a via wiring formation substrate produced through a via wiring formation substrate production method as recited in the thirty-eighth mode; a step of providing a semiconductor chip having copper terminals as connection terminals on the insulating layer of the via wiring formation substrate and joining the semiconductor chip onto the insulating layer by the mediation of an adhesive, while the copper terminals oppositely face the via wiring formation vias of the via wiring formation substrate; a step of forming an embedding insulating layer in which the semiconductor chip is embedded; a step of releasing the releasable adhesive layer and the support substrate; a step of removing the metal layer; and a step of embedding the via wiring formation vias with copper from the side opposite the semiconductor chip-provided side, to thereby form via wirings connected to the copper terminals.

In a forty-third mode of the present invention, there is provided a method for mounting a semiconductor chip, characterized in that the method comprises a step of providing a via wiring formation substrate as recited in the thirty-fifth or thirty-seventh mode or a via wiring formation substrate produced through a via wiring formation substrate production method as recited in the fortieth mode; a step of providing a semiconductor chip having copper terminals as connection terminals on the insulating layer of the via wiring formation substrate and joining the semiconductor chip onto the insulating layer by the mediation of an adhesive, while the copper terminals oppositely face the via wiring formation vias of the via wiring formation substrate; a step of forming an embedding insulating layer in which the semiconductor chip is embedded; a step of releasing the releasable adhesive layer and the support substrate; a step of removing the first metal layer; a step of embedding the via wiring formation vias with copper from the side opposite the semiconductor chip-provided side, to thereby form via wirings connected to the copper terminals; and a step of forming a wiring pattern by use of the second metal layer.

As described above, the present invention enables provision of semiconductor device-mounted component products by use of a via wiring formation substrate which can achieve simultaneous mounting of semiconductor chips having different heights without advance preparation of columnar electrical connectors.

MODES FOR CARRYING OUT THE INVENTION

The present invention will next be described in more detail.

Firstly, there will be described a via wiring formation substrate for use in production of the semiconductor device-mounted component product of the present invention.

Substrate Embodiment 1

Figure 1:
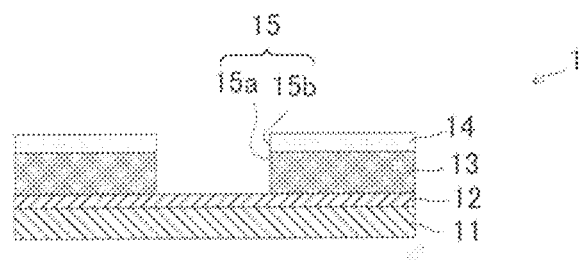
FIG. 1 A sectional view of a via wiring formation substrate according to Substrate Embodiment 1.
Figure 2:
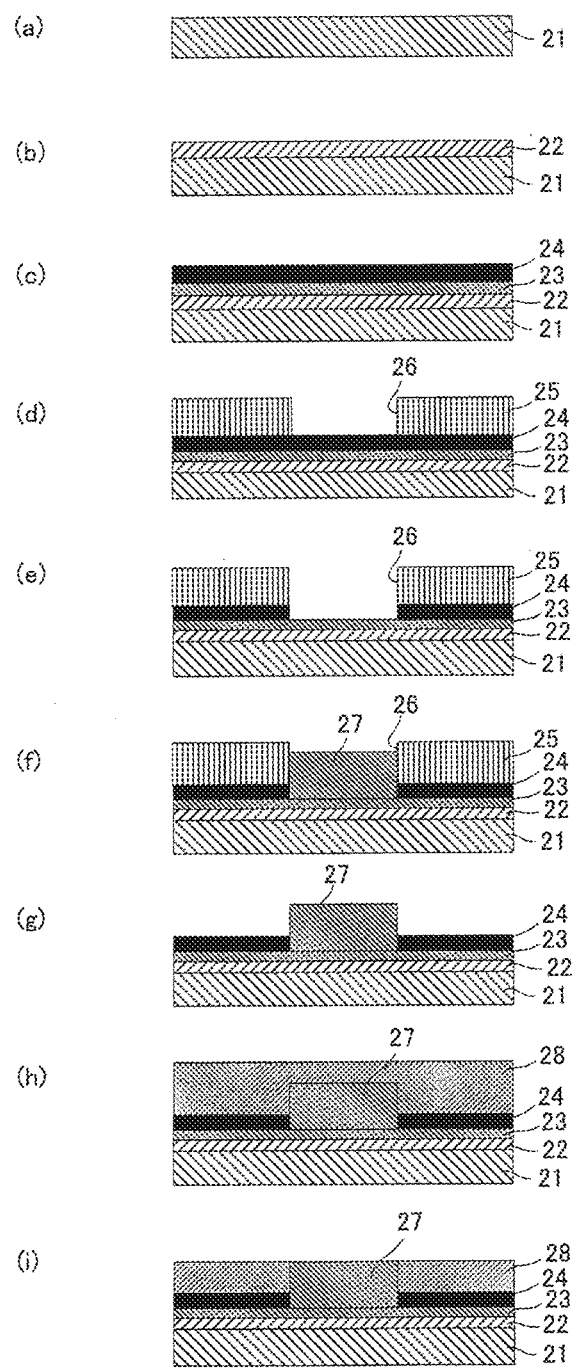
FIG. 2 A sectional view showing a production process for the via wiring formation substrate according to Substrate Embodiment 1.
Figure 3:
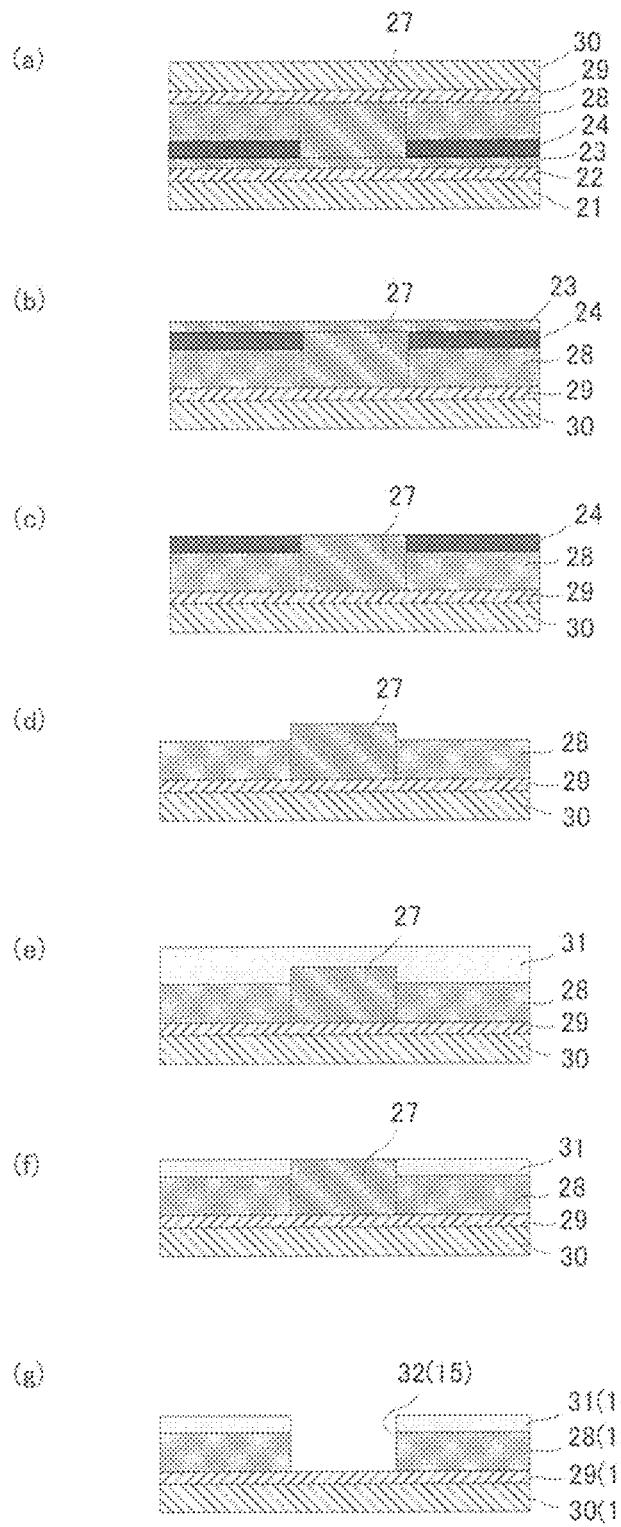
FIG. 3 A sectional view showing a production process for the via wiring formation substrate according to Substrate Embodiment 1.

FIG. 1 is a sectional view of a via wiring formation substrate according to Substrate Embodiment 1, and FIGS. 2 and 3 are sectional views showing a production process for the via wiring formation substrate according to Substrate Embodiment 1.

As shown in the drawings, a via wiring formation substrate 1 has a support substrate 11, a releasable adhesive layer 12 provided on one side of the support substrate 11, a first insulating layer 13 provided on the releasable adhesive layer 12, and a second insulating layer 14 provided on the first insulating layer 13. A plurality of via wiring formation vias 15 are provided so as to penetrate only through the first insulating layer 13 and the second insulating layer 14.

The via wiring formation via 15 is a hole in which via wirings are formed. In one specific mode, the via wiring formation vias are provided so that they align with the positions of connection terminals of a semiconductor chip to be mounted on an FO-WLP to be fabricated, and the positions of via wirings formed around the mounted semiconductor chip.

The via wiring formation vias 15 penetrate only through the first insulating layer 13 and the second insulating layer 14, independent from the support substrate 11 and the releasable adhesive layer 12 provided on one side of the support substrate 11. The via wiring formation vias 15 penetrate only through the first insulating layer 13 and the second insulating layer 14 without misalignment. As used herein, the expression "penetrating without misalignment" refers to the state in which a via 15a penetrating the first insulating layer 13 of the via wiring formation via 15 and a via 15b penetrating the second insulating layer 14 are provided continuously and jointly without misalignment.

The first insulating layer 13 and the second insulating layer 14 are not self-standing layers, and must be supported by the support substrate 11. Also, since the first insulating layer 13 differs from the second insulating layer 14 in terms of the material, mechanical properties, processability, etc., the two layers cannot be processed through drilling or laser machining. The via wiring formation vias 15 penetrating only through the first insulating layer 13 and the second insulating layer 14 which are supported by the support substrate 11 can be provided through such a novel photolithography process as described below.

Here, the via wiring formation vias 15 provided in the first insulating layer 13 and the second insulating layer 14 which are supported by the support substrate 11 have high positional accuracy corresponding to a photolithography process level. Thus, a pore size and pitches can be reduced to values smaller than those obtained by drilling. Each via wiring formation via 15 is a straight via having a diameter of 15 μm to 70 μm, and the positional accuracy is of a photolithography level, for example, ±5 μm or less.

The first insulating layer 13 and the second insulating layer 14 are not self-standing layers, and must be supported by the support substrate 11. Thus, if unsupported, a set of the first insulating layer 13 or the second insulating layer 14 cannot be processed through drilling or laser machining for providing via wiring formation vias 15. Even when the vias are provided through drilling, the pore diameter and process accuracy are limited to about 75 μm and ±5 μm. As a result, a through hole having a diameter of 70 μm or less cannot be provided, and merely a positional accuracy of about ±10 μm can be attained. Furthermore, through laser machining, a taper-shape hole is provided instead of a straight hole. In addition, the support substrate 11 may be damaged, thereby impeding reuse of the support substrate 11.

The total thickness of the first insulating layer 13 and the second insulating layer 14 is selected from a range of 15 μm to 70 μm. The thickness of the first insulating layer 13 is selected from a range of 5 μm to 50 μm, and that of the second insulating layer 14 is selected from a range of 3 μm to 35 μm. A laminate having such a thickness itself is not a self-standing laminate and cannot be handled in a mounting process. Thus, the laminate must be subjected to a mounting process with a support substrate. Notably, the thickness of each of the first insulating layer 13 and that of the second insulating layer 14 may be selected from the aforementioned ranges.

Also, the via wiring formation vias 15 are provided through etching a metal layer or a plating metal by the mediation of a resist formed through a photolithography process. Thus, differing from a mechanical process, production cost of a larger number of vias does not severely increase, which is advantageous. In addition, differing from the case of drilling or laser machining, the via wiring formation vias 15 can be provided at a high positional accuracy equivalent to that of a photolithography process, regardless of the processability of the first insulating layer 13 and that of the second insulating layer 14. In other words, the materials of the first insulating layer 13 and the second insulating layer 14 can be freely selected.

The pore size of each via wiring formation via 15 and the minimum pitch may be values which are difficult to attain through drilling. However, the values may fall within ranges where drilling can be performed. The pore size of each via wiring formation via 15 is, for example, 15 μm to 70 μm, preferably 20 μm to 50 μm, and the minimum pitch is 50 μm to 200 μm.

The support substrate 11 is a substrate temporarily used in the production process for enhancing handling characteristics, and is reusable. The material of the support substrate essentially has considerable mechanical strength, a small thermal expansion coefficient, high dimensional stability, and resistance to an etchant used on the photolithography process. When the releasable adhesive layer 12 is released through irradiation with light, the substrate allows passage of the light of the employed wavelength, whereas when the releasable adhesive layer 12 is released through heating, the substrate is not necessarily transparent. The support substrate 11 may be a glass plate, a metal plate, a resin plate, or the like. Among them, a glass plate is preferred.

The releasable adhesive layer 12 is a layer which is not released in the production process, but can be released, in accordance with need, through irradiation with light, heating, or the like. No particular limitation is imposed on the releasable adhesive layer, so long as the layer has the above functions. One possible example of the releasable adhesive layer is "UV release tape SELFA-SE" (product of Sekisui Chemical Co., Ltd.), which is releasable through UV radiation. An example of the releasable adhesive layer which can be released through heating contains an adhesive including a foaming agent which expands through heating at a predetermined temperature.

The first insulating layer 13 may be formed from a thermosetting resin material of low thermal expansion coefficient, which material contains a thermosetting resin (e.g., epoxy resin) and an inorganic filler (e.g., silica). Particularly, an epoxy sealing resin may be used. In any case, the first insulating layer is formed of an insulating material having durability which allows use as a structural component of a wiring substrate, instead of a photosensitive resist resin or the like, which is partially photo-sensitized through a mask and whose unexposed portion can be removed through development. Thus, the first insulating layer 13 cannot directly be provided with through holes through photolithography with etching or a similar process.

By virtue of the presence of the second insulating layer 14 on the first insulating layer 13, an active surface of a semiconductor chip does not come into direct contact with the first insulating layer 13 in mounting of the semiconductor chip. Therefore, a low-impurity, halogen-free insulating material is not necessarily used. However, since via wiring formation vias 15 are provided at minute pitches, a thermosetting resin material containing a microfiller is preferably used. The maximum particle size of the filler is preferably about 5 μm to about 30 μm.

The second insulating layer 14 is formed of a thermosetting or thermoplastic resin material which contains no filler or which has a filler content and an elastic modulus lower than those of the first insulating layer 13. Such resin material is employed for the purpose of lowering, as compared with the first insulating layer 13, the resiliency of the second insulating layer 14 which is disposed on the first insulating layer 13 and onto which a semiconductor chip is directly mounted. In addition, since the second insulating layer 14 is brought into direct contact with the active surface of the semiconductor chip to be mounted, a halogen-free resin material of low-purity is used.

As the resin material having such properties, an adhesive resin having a flowability lower than that of a conventional adhesive may be used. In this case, an adhesive resin layer may be formed from an adhesive resin such as an epoxy resin, a phenolic resin, or a polyimide resin.

Through provision of the second insulating layer 14, as mentioned below, crack generation is advantageously prevented in molding a semiconductor chip which has been joined to the second insulating layer 14, as compared with the case of direct joining to the first insulating layer 13. This is attributed to low resiliency of the second insulating layer 14. In contrast, when a semiconductor chip is directly jointed to the first insulating layer 13 and molded, cracking may occur due to excessively high rigidity of the first insulating layer 13. The aforementioned technical features of the present invention solve such problems.

The aforementioned adhesive resin layer may be formed through printing an adhesive resin or attaching an adhesive resin sheet.

As described below, the second insulating layer 14 serves as a face to be in contact with the active surface of a semiconductor chip and requires such an appropriate flowability as to follow irregularities of the active surface. However, if the flowability is excessively high, the second insulating layer intrudes into the via wiring formation vias 15. Thus, a resin having an appropriate elasticity and flowability is preferably used. In the present embodiment, a non-flow adhesive layer (NFA) having a flowability lower than that of a conventional adhesive is employed as the second insulating layer 14. In this case, a commercial low-resilience die bonding film, for example, a product of "HS series" (products of Hitachi Chemical Co., Ltd.), may be used.

As shown in the below-mentioned production process, the via wiring formation vias 15 can be provided with pore size and pitches as obtained through photolithography. However, the depth (aspect ratio) and the uniformity in pore size in the depth direction are superior to those obtained in the case where the first insulating layer 13 and the second insulating layer 14 are directly provided with via wiring formation vias through a photolithography process. Notably, since the support substrate 11 is present, the via wiring formation vias cannot be provided through laser machining or drilling. Even if such processing is possible in the absence of the support substrate, the vias obtained through this processing have a pore size and pitches superior to those obtained through photolithography or the like. Thus, via wiring formation vias having a suitable depth (aspect ratio) and uniformity in pore size in the depth direction can be produced.

The via wiring formation vias 15 are provided so as to be adapted to the terminal configuration and dimensions of a semiconductor chip to be mounted and the configuration and dimensions of columnar via wirings to be provided around the semiconductor chip. No particular limitation is imposed on the pore size and pitches of the via wiring formation vias, since a plurality of such vias having different pore sizes are provided via patterning. However, the pore size is 15 µm to 70 µm, preferably 20 µm to 50 µm, and the minimum pitch is 50 µm to 200 µm, preferably 50 µm to 120 µm, more preferably 50 µm to 100 µm.

With reference to FIGS. 2 and 3, an example of the process for producing the via wiring formation substrate 1 will next be described.

Firstly, a glass-made first support substrate 21 is provided (FIG. 2(a)). On one surface of the substrate, a first releasable adhesive layer 22 is provided (FIG. 2(b)). The first releasable adhesive layer 22 may be provided through coating or attaching a sheet-form adhesive layer. In this embodiment, "UV release tape SELFA-HW" (product of Sekisui Chemical Co., Ltd.) is attached.

Next, the first metal layer 23 and the second metal layer 24 are formed on the first releasable adhesive layer 22 (FIG. 2(c)). The etching characteristic of the first metal layer 23 differs from that of the second metal layer 24, in order to etch only the second metal layer 24 by the mediation of the first metal layer 23 serving as an etching stop layer in a subsequent step. In consideration of a resist layer serving as a mask, the second metal layer is preferably etched with an acidic etchant.

The metal for forming the first metal layer 23 and the second metal layer 24 may be selected from metals such as titanium (Ti), silver (Ag), aluminum (Al), tin (Sn), nickel (Ni), copper (Cu), etc. The etchant for Ti is, for example, $NH_4FHF$—$H_2O_2$, and that for Ag is, for example, $CH_3COOH$—$H_2O_2$. The etchant for Al is, for example, HCl, and that for Sn is $NH_4FHF$—$H_2O_2$. The etchant for Ni is, for example, HCl. In one case where a metal selected from these metals is employed in either of the metal layers, examples of the etchant which realize etching Cu serving as an etching stop layer include $FeCl_3$, $Cu(NH_3)_2$, and $H_2SO_4$—$H_2O_2$.

Examples of the combination of metals forming the first metal layer 23 and the second metal layer 24 include, but are not limited to, Ti—Cu, Ag—Cu, Al—Cu, Sn—Cu, Ni—Cu, Ni—Ti, Ni—Sn, Al—Ti, Al—Sn, Ti—Ag, Al—Ag, An—Ag, and Ni—Ag.

No particular limitation is imposed on the method for forming the first metal layer 23 and the second metal layer 24, and there may be employed various methods such as film formation methods such as vapor phase film-formation and plating, and attaching foil or sheet. In consideration of operational efficiency, attaching of a commercial double-layered metallic sheet is preferred.

In this embodiment, the first metal layer 23 is formed of nickel, and the second metal layer 24 is formed of copper, and the two layers are bound together. In the embodiment, the thickness of the first nickel layer 23 is 0.5 µm, and that of the second copper layer 24 is 12 µm. No particular limitation is imposed on the thickness of the first metal layer 23, and the thickness is essentially about 0.5 µm to about 5 µm. If the thickness is in excess of the range, no further effect is attained. The thickness of the second metal layer 24 is virtually equivalent to that of the second insulating layer 14 of the via wiring formation substrate 1. Thus, the thickness of the second metal layer must be tuned corresponding to the thickness of the second insulating layer 14. The thickness, depending on use of the via wiring formation substrate 1, is about 5 µm to about 40 µm, preferably about 5 µm to about 35 µm.

Notably, in the present specification, the expression "nickel" or "copper" encompasses to include an additional element of interest or unavoidable impurities. In some cases, such a metal including an additional element of interest or unavoidable impurities may also be referred to as a "nickel alloy" or a "copper alloy."

Next, a resist layer 25 is formed on the second metal layer 24, and openings 26 penetrating the resist layer 25 are provided through conventionally employed photoresist patterning (FIG. 2(d)). The thickness of the resist layer 25 is a key factor (not direct) for determining the thickness of the first insulating layer 13 of the via wiring formation substrate 1. Also, the patterning characteristics; i.e., the shapes of openings 26 (pore sizes and vertical degrees), are reflected to the shapes of the via wiring formation vias 15. Therefore, the resist resin forming the resist layer 25 may be positive or negative. However, a resist resin meeting the aforementioned requirements is preferably selected. Examples of preferred resist resins include "PHOTEC PKG for formation of wiring substrates Series RY" (products of Hitachi Chemical Co., Ltd.). In this embodiment, the thickness of the resist layer and the diameter of each opening 26 are tuned to 35 μm and 30 μm, respectively.

For patterning, UV exposure is performed at 100 to 300 mJ/cm$^2$, and development is performed by spraying 1% Na$_2$CO$_3$ solution for 30 seconds.

Subsequently, only the second metal layer 24 formed of Cu in each opening 26 is etched with the thus-patterned resist layer 25 as a mask (FIG. 2(e)). In this example, the second metal layer 24 can be exclusively etched with the first metal layer 23 formed of Ti as an etching stop layer by use of FeCl$_3$, Cu(NH$_3$)$_2$, or H$_2$SO$_4$—H$_2$O$_2$ as an etchant.

Then, the first metal layer 23 which formed of Ni and exposed to each opening 26 is employed as an electrode, and a metal column 27 formed of nickel is provided in the opening 26 (FIG. 2(f)). In this example, the thickness (height) of the metal column 27 is adjusted to 20 μm.

In the above example, the metal column 27 is formed from nickel. However, no particular limitation is imposed on the metal of the metal column, so long as the metal has etching resistance during removal of the second metal layer 24 through etching in the below-mentioned process. The metal may be identical to or different from that of the first metal layer 23.

The metal column 27 is provided through electroplating. However, no particular limitation is imposed on the metal provision method, so long as the method can achieve complete filling of the opening 26 with the metal.

Subsequently, the resist layer 25 is removed (FIG. 2(g)), and a first mold resin 28 serving as the first insulating layer 13 is applied (FIG. 2(h)). Thereafter, the first mold resin 28 is ground so as to expose the upper surface of the metal column 27 covered with the first mold resin 28 (FIG. 2(i)).

The first mold resin 28 may be formed from the same resin material as employed for forming the aforementioned first insulating layer 13. The thickness is adjusted to such a level as to cover the metal column 27. No particular limitation is imposed on the method of applying the first mold resin 28, and there may be employed various application techniques such as vacuum printing, film lamination, and compression molding using a metal mold. In this example, a molding resin R4212 (product of Nagase ChemteX Corporation) is used, and the resin is compression-molded at 120° C. for 10 minutes. Post-curing is performed at 150° C. for 1 hour, to thereby produce the first mold resin 28.

Grinding for exposing the upper surface of the metal column 27 may be carried out by means of a conventional grinder such as a diamond byte.

Then, on the first mold resin 28 at which the upper surface of the metal column 27 is exposed, a second support substrate 30 is provided by the mediation of a second releasable adhesive layer 29 (FIG. 3(a)). The second support substrate 30 and the second releasable adhesive layer 29 respectively serve as the support substrate 11 and the releasable adhesive layer 12 of the via wiring formation substrate 1. The second releasable adhesive layer 29 may be provided through coating or attaching a sheet-form adhesive layer. In this embodiment, "UV release tape SELFA-HW" (product of Sekisui Chemical Co., Ltd.) is attached. The second support substrate 30 is formed of a glass substrate.

Next, the entire structure is turned upside down, and the first releasable adhesive layer 22 is released, to thereby remove the first support substrate 21 (FIG. 3(b)). Then, the first metal layer 23 forming the top surface is removed (FIG. 3(c)). The first metal layer 23 may be removed through etching or grinding. Alternatively, grinding may be performed after etching. In the case of etching, hydrochloric acid solution, sulfuric acid, or a sulfuric acid-hydrogen peroxide mixture (H$_2$SO$_4$—H$_2$O$_2$) may be used as an etchant.

Then, the second metal layer 24 is removed, to thereby expose the top end of the metal column 27 (FIG. 3(d)). Removal of the second metal layer 24 is performed through etching. In this case, FeCl$_3$, Cu(NH$_3$)$_2$, H$_2$SO$_4$—H$_2$O$_2$, etc. may be used as an etchant.

Then, a second resin layer 31 serving as the second insulating layer 14 is provided so as to cover the top end of the metal column 27 (FIG. 3(e)). Thereafter, the second resin layer 31 is ground so as to expose the top end surface of the metal column 27 (FIG. 3(f)). The material of the second resin layer 31 may be the material of the second insulating layer 14. Grinding for exposing the top surface of the metal column 27 may be carried out by means of a conventional grinder such as a diamond byte.

Subsequently, the metal column 27 is removed by etching, to thereby provide a via wiring formation via 32a serving as the via wiring formation via 15 of the via wiring formation substrate 1 (FIG. 3(g)). Through the aforementioned procedure, there is provided the via wiring formation substrate 1 having the support substrate 11 and the releasable adhesive layer 12, and the first insulating layer 13 and the second insulating layer 14 formed thereon, wherein the via wiring formation via 15 is provided so as to penetrate only through the first insulating layer 13 and the second insulating layer 14.

Substrate Embodiment 2

Figure 4:
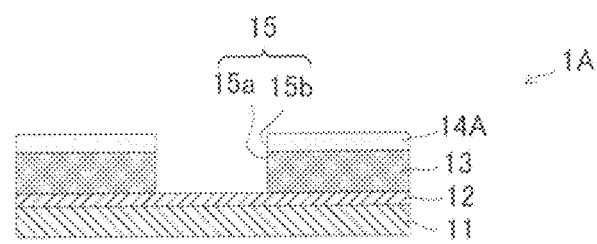
FIG. 4 A sectional view of a via wiring formation substrate according to Substrate Embodiment 2.

FIG. 4 is a sectional view of a via wiring formation substrate according to Substrate Embodiment 2.

As shown in FIG. 4, a via wiring formation substrate 1A has a support substrate 11, a releasable adhesive layer 12 provided on one side of the support substrate 11, a first insulating layer 13 provided on the releasable adhesive layer 12, and a second insulating layer 14A provided on the first insulating layer 13. A plurality of via wiring formation vias 15 are provided so as to penetrate only through the first insulating layer 13 and the second insulating layer 14A.

The via wiring formation substrate 1A is the same as in Embodiment 1, except that the second insulating layer 14A is not a non-flow adhesive layer (NFA) and is formed of a thermosetting or thermoplastic resin material which contains no filler or which has a filler content and an elastic modulus lower than those of the first insulating layer 13. The production process is also the same. Thus, overlapping descriptions are omitted. In a specific procedure, "HS-270 (DAF)" (product of Hitachi Chemical Co., Ltd.) is used as the second insulating layer 14A. Lamination is performed at 80° C. to 200° C., and bonding is performed at 120° C. to 160° C. and 0.02 MPa to 0.2 MPa for 30 seconds.

Notably, as the resin material of the second insulating layer 14, there may also be employed a photosensitive resin such as a photosensitive polyimide resin for forming the re-wiring layer or a thermosetting resin.

Substrate Embodiment 3

Figure 5:
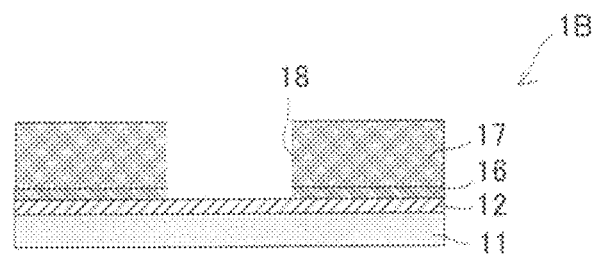
FIG. 5 A sectional view of a via wiring formation substrate according to Substrate Embodiment 3.

FIG. 5 is a sectional view of a via wiring formation substrate according to Substrate Embodiment 3.

As shown in FIG. 5, the via wiring formation substrate 1B includes a support substrate 11, a releasable adhesive layer 12 disposed on one surface of the support substrate 11, and a metal layer 16 and an insulating layer 17 disposed on the releasable adhesive layer 12. The via wiring formation substrate 1B has a plurality of via wiring formation vias 18 provided so as to penetrate only the metal layer 16 and the insulating layer 17.

In any case, each of the via wiring formation vias 18 is a hole for forming a via wiring. For example, the vias 18 are provided so as to correspond to the positions of connection terminals of a semiconductor chip mounted on an FO-WLP to be produced, and the positions of via wirings provided in the periphery of the mounted semiconductor chip.

The insulating layer 17 may be formed from, for example, a thermosetting resin material of low thermal expansion coefficient prepared by mixing of a thermosetting resin (e.g., epoxy resin) with an inorganic filler such as silica. In particular, the insulating layer 17 may be formed from an epoxy sealing resin. In any case, the insulating layer 17 is formed of a durable insulating material that can be used as a wiring substrate structure, rather than a photosensitive resist resin that enables partial light exposure through a mask and removal of an unexposed portion through development. Thus, through holes cannot be directly provided in the insulating layer 17 through, for example, etching in a photolithography process.

Since the insulating layer 17 may possibly come into direct contact with an active surface of a semiconductor chip, the insulating layer 17 is preferably formed from a halogen-free material containing a small amount of an impurity. Since the via wiring formation vias 18 are provided at small pitches, the insulating layer 17 is preferably formed from a resin material containing fine filler particles having a maximum particle size of about 5 µm to about 30 µm.

The via wiring formation vias 18 are provided so as to penetrate only the metal layer 16 and the insulating layer 17 independent from the support substrate 11 and the releasable adhesive layer 12.

The via wiring formation vias 18 are straight vias having a diameter of 15 µm to 70 µm. The positional accuracy of the vias corresponds to a photolithography-level accuracy; specifically, about ±5 µm or less.

Each of the metal layer 16 and the insulating layer 17 cannot stand by itself, and must be supported by the support substrate 11. The via wiring formation vias 18 cannot be provided through drilling or laser machining of only the metal layer 16 and the insulating layer 17. Even if the vias are provided through drilling, the vias have a diameter of at least about 75 µm, and the processing accuracy is ±5 µm. Thus, through holes having a diameter of 70 µm or less cannot be provided, and the positional accuracy of the holes becomes about ±10 µm. When laser machining is performed, tapered holes are provided; i.e., straight holes cannot be provided. The via wiring formation via 18 penetrating only the metal layer 16 and the insulating layer 17 supported by the support substrate 11 can be provided through a novel process described below.

The total thickness of the metal layer 16 and the insulating layer 17 is determined to fall within a range of 15 µm to 70 µm. The thickness of the metal layer 16 is determined to fall within a range of 1 µm to 20 µm, and the thickness of the insulating layer 17 is determined to fall within a range of 5 µm to 20 µm. The laminate having such a thickness does not stand by itself, and cannot be handled in a mounting process. Thus, the laminate must be subjected to a mounting process together with the support substrate. The thickness of the first insulating layer 13 or the second insulating layer 14 may be determined so as to fall within the aforementioned range.

Since the metal layer 16 can be used as a shield layer for a ground wiring or a semiconductor chip, or used as a heat spreading layer for heat release of the semiconductor chip, the thickness of the metal layer 16 may be determined in consideration of the electrical conductivity or thermal conductivity required for the aforementioned functions.

The support substrate 11 is temporarily used for improving handling performance in the production process and can be recycled. The support substrate 11 is formed from a material which achieves high mechanical strength, low thermal expansion coefficient, and high dimensional stability and which exhibits resistance to an etchant used in the process described below. When the releasable adhesive layer 12 is released through light irradiation, the substrate must be transparent to a wavelength to be used, whereas when the releasable adhesive layer 12 is released through heating, the substrate is not necessarily transparent. The support substrate 11 may be, for example, a glass plate, a metal plate, or a resin plate, and is preferably a glass plate.

The releasable adhesive layer 12 is not released in the production process, but is releasable through, for example, light irradiation or heating as appropriate. No particular limitation is imposed on the releasable adhesive layer 12, so long as it has such a function. The releasable adhesive layer 12 may be, for example, a layer that can be released through ultraviolet (UV) irradiation, such as "UV release tape SELFA-HW" (product of Sekisui Chemical Co., Ltd.). The releasable adhesive layer 12 may be a layer that can be released through heating, such as a layer formed of an adhesive containing a foaming agent that expands through heating at a predetermined temperature.

As described above, the insulating layer 17 may be formed from, for example, a mold resin prepared by mixing of a thermosetting resin (e.g., epoxy resin) with a filler. In particular, the insulating layer 17 may be formed from an epoxy sealing resin.

As shown in the below-mentioned production process, the via wiring formation vias 18 can be provided to achieve a diameter and pitch with an accuracy comparable to that in the case of vias provided through photolithography. However, the via wiring formation vias 18 exhibit uniformity in depth (aspect ratio) and diameter (in a depth direction) superior to that in the case of vias provided directly in the insulating layer 17 by a photolithography process. In other words, although the insulating layer 17 is photosensitive, and vias can be directly provided therein through light exposure and development, the filler contained in the insulating layer 17 is likely to cause non-uniformity in light refraction or light transmission and a large variation in coating thickness, resulting in non-uniformity in hole diameter. However, according to the process of the present invention, vias provided in a resist of high resolution can be transferred by the mediation of metal columns, and thus the vias have a diameter and pitch with an accuracy comparable to that in the case of vias provided through photolithography. Notably, since the support substrate 11 is present, via wiring formation vias cannot be provided through laser machining or drilling. Even if such processing is possible in the absence of the support substrate, the vias obtained through this processing have a pore size and pitches superior to those obtained through photolithography or the like. Thus, via wiring formation vias having a suitable depth (aspect ratio) and uniformity in pore size in the depth direction can be produced.

The via wiring formation vias 18 are provided so as to correspond to the position and dimensions of terminals of a semiconductor chip to be mounted, and the position and dimensions of columnar via wirings to be formed around the terminals. Since a plurality of the vias having different diameters are provided through patterning, the diameter and pitch of the vias are not univocally determined. However, the diameter is 15 μm to 70 μm, preferably 20 μm to 50 μm, and the minimum pitch is 50 μm to 200 μm, preferably 50 μm to 120 μm, still more preferably 50 μm to 100 μm.

Next will be described an example of the production process for the via wiring formation substrate 1B with reference to FIG. 6.

Figure 6:
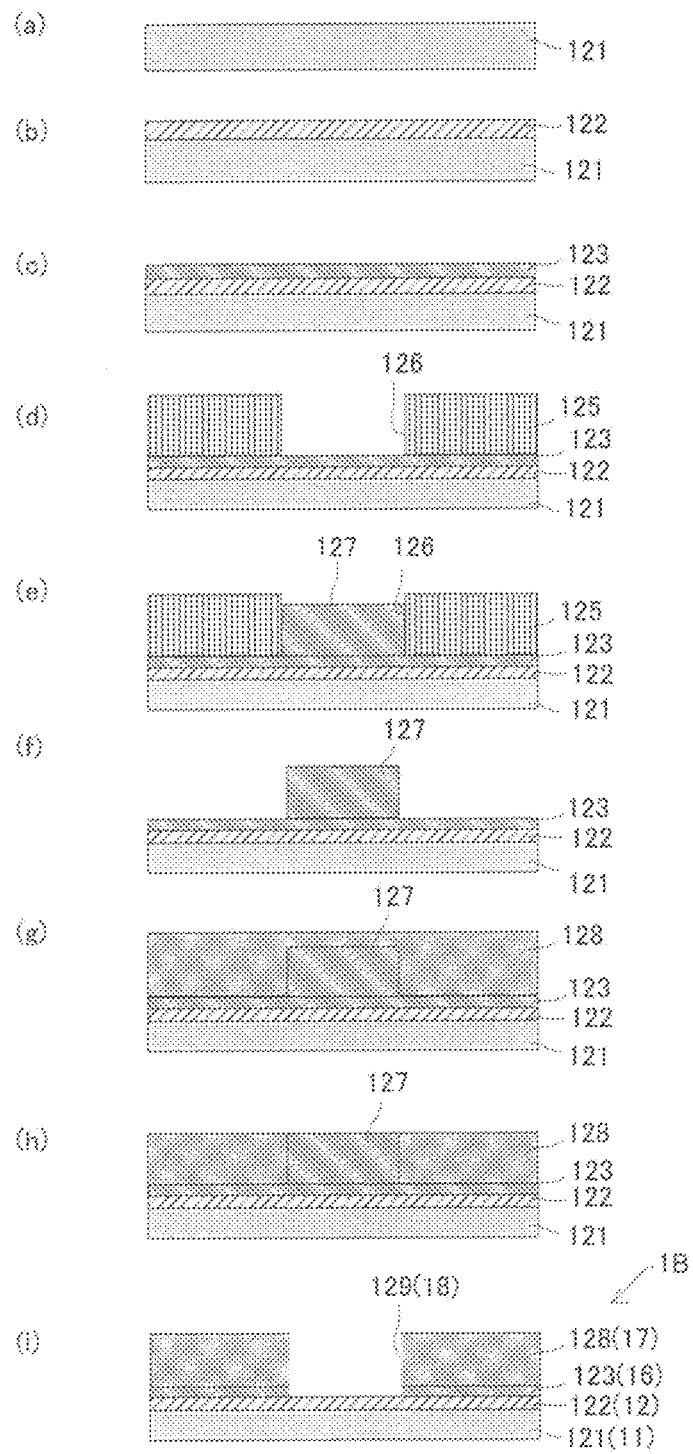
FIG. 6 A sectional view showing a production process for the via wiring formation substrate according to Substrate Embodiment 3.

Firstly, a support substrate 121 made of, for example, glass is provided (FIG. 6(*a*)), and a releasable adhesive layer 122 is disposed on one surface of the substrate 121 (FIG. 6(*b*)). The releasable adhesive layer 122 may be provided through coating or attachment of a sheet-form adhesive layer. In this case, "UV release tape SELFA-HW" (product of Sekisui Chemical Co., Ltd.) is attached.

Subsequently, a metal layer 123 is disposed on the releasable adhesive layer 122 (FIG. 6(*c*)). Preferably, the metal layer 123 can be etched with an acidic etchant in consideration of the relationship between the metal layer and a resist layer serving as a mask.

The metal forming the metal layer 123 may be selected from among, for example, titanium (Ti), silver (Ag), aluminum (Al), tin (Sn), nickel (Ni), and copper (Cu). The metal is preferably copper.

The etchant for Ti is, for example, $NH_4FHF$—$H_2O_2$; the etchant for Ag is, for example, $CH_3COOH$—$H_2O_2$; the etchant for Al is, for example, HCl; the etchant for Sn is $NH_4FHF$—$H_2O_2$; and the etchant for Ni is, for example, HCl. For example, when any of these metals are used in the metal layer 123, $FeCl_3$, $Cu(NH_3)_2$, or $H_2SO_4$—$H_2O_2$ can be used as an etchant for etching of the metal and Cu used in an etching stop layer.

Notably, in the present specification, the expression "nickel" or "copper" encompasses to include an additional element of interest or unavoidable impurities. In some cases, such a metal including an additional element of interest or unavoidable impurities may also be referred to as a "nickel alloy" or a "copper alloy."

No particular limitation is imposed on the method for forming the metal layer 123, and the metal layer 123 may be formed through, for example, any vapor phase film formation process, film formation through plating, or attachment of a foil or a sheet. In consideration of working efficiency, the metal layer 123 is preferably provided through attachment of a commercially available metal foil.

In the present embodiment, the metal layer 123 is provided through attachment of a metal foil made of Cu. In this embodiment, the metal layer 123 (Cu layer) has a thickness of 0.5 μm.

Next, a resist layer 125 is formed on the metal layer 123, and an opening 126 having a predetermined pattern is provided so as to penetrate the resist layer 125 through photoresist patterning (i.e., a common technique) (FIG. 6(*d*)). The thickness of the resist layer 125 indirectly affects the thickness of the insulating layer 17 of the via wiring formation substrate 1, and the patterning characteristic of the resist layer 125 (i.e., the shape (diameter and verticality) of the opening 126) is transferred to the shape of the via wiring formation via 18. Thus, the resist resin forming the resist layer 125, which may be of positive or negative type, is preferably a resist resin satisfying the aforementioned required characteristics. Examples of preferred resist resins include "PHOTEC RY Series for PKG Board" (product of Hitachi Chemical Co., Ltd.).

Subsequently, the patterned resist layer 125 is used as a mask, and a Cu metal column 127 is formed on a portion of the Ni metal layer 123 (serving as an electrode) exposed through the opening 126 (FIG. 6(*e*)). In this embodiment, the thickness of the metal column 127 is 25 μm. The thickness of the metal column 127 directly relates to the aforementioned depth of the via wiring formation via 18, and thus the thickness of the metal column 127 is determined depending on the required depth.

In this embodiment, the metal column 127 is formed of copper, which is the same material as that of the metal layer 123. However, the metal column 127 may be formed of a metal identical to or different from that forming the metal layer 123.

The metal column 127 is formed through electroplating. The metal column 127 is not necessarily formed through electroplating, so long as the opening 126 is completely filled. However, the metal column 127 can be most efficiently formed at low cost through electroplating.

Subsequently, the resist layer 125 is removed (FIG. 6(*f*)), and a mold resin 128 to become the insulating layer 17 is applied (FIG. 6(*g*)). Thereafter, the mold resin 128 is ground so as to expose the top surface (first end surface) of the metal column 127 covered with the mold resin 128 (FIG. 6(*h*)).

The mold resin 128 may be a resin material to serve as the aforementioned insulating layer 17. The thickness of the mold resin is adjusted so as to cover the metal column 127. No particular limitation is imposed on the method for application of the mold resin 128, and the mold resin 128 can be applied through, for example, vacuum printing, film lamination, or compression molding using a mold. In this embodiment, mold resin (R4212, product of Nagase ChemteX Corporation) is used, and the mold resin 128 is formed through compression molding (120° C., 10 min) and curing (post-cure conditions: 150° C., 1 h).

The grinding for exposure of the top surface of the metal column 127 can be performed by means of a common grinder such as a diamond bite.

Next, the metal column 127 and a portion of the metal layer 123 are removed through etching, to thereby provide a via wiring formation via 129 to serve as the via wiring formation via 18 of the via wiring formation substrate 1 (FIG. 6(*i*)). This process produces the via wiring formation substrate 1B including the support substrate 11, the releasable adhesive layer 12, and the metal layer 16 and insulating layer 17 disposed on the layer 12, and having the via wiring formation vias 18 each penetrating only the metal layer 16 and the insulating layer 17 (see FIG. 5).

As described above, each via wiring formation via 18 is provided by transferring the opening 126 provided in the resist layer 125 through a photolithography process into the insulating layer 17 (mold resin 128) by the mediation of the metal column 127. Thus, the dimensions and the positional accuracy of the via correspond to those achieved by a photolithography process (as used herein, the positional accuracy of the via referred to as "a positional accuracy of a photolithography level").

In the aforementioned embodiment, the insulating layer 17 is formed from a mold resin that is generally used for molding (e.g., an epoxy resin containing a filler such as silica). In general, the via wiring formation vias 18 cannot be provided at the aforementioned accuracy in the insulating layer 17. In the aforementioned embodiment, each via wiring formation via 18 penetrates both the insulating layer 17 and the metal layer 16. Since the via in the insulating layer 17 and the via in the metal layer 15 are provided through the aforementioned process, the vias are provided without misalignment so that the inner walls thereof extend straightly. Thus, the via wiring formation vias 18 are provided at a high positional accuracy (i.e., accuracy of a photolithography level). That is, a novel structure is achieved.

The material of the insulating layer 17 may be a thermosetting resin or a photocurable thermosetting resin (e.g., an epoxy resin containing no or small amount of a filler), so long as desired strength, durability, and desired thermal expansion coefficient can be achieved. Such a material exhibits surface smoothness superior to that of a common mold resin, and thus is advantageous in that, for example, fine wirings can be formed on the surface of the material through the mounting process described below. Therefore, such a material is selected depending on the intended use. Although a photocurable thermosetting resin can be formed into an insulating layer through photocuring and subsequent thermal curing, the photocurable resin cannot be subjected to fine patterning for direct formation of via wiring formation vias.

Component Mounting Embodiment 1

Next will be described an exemplary process for mounting a semiconductor chip on the via wiring formation substrate 1 with reference to the drawings.

Figure 7:
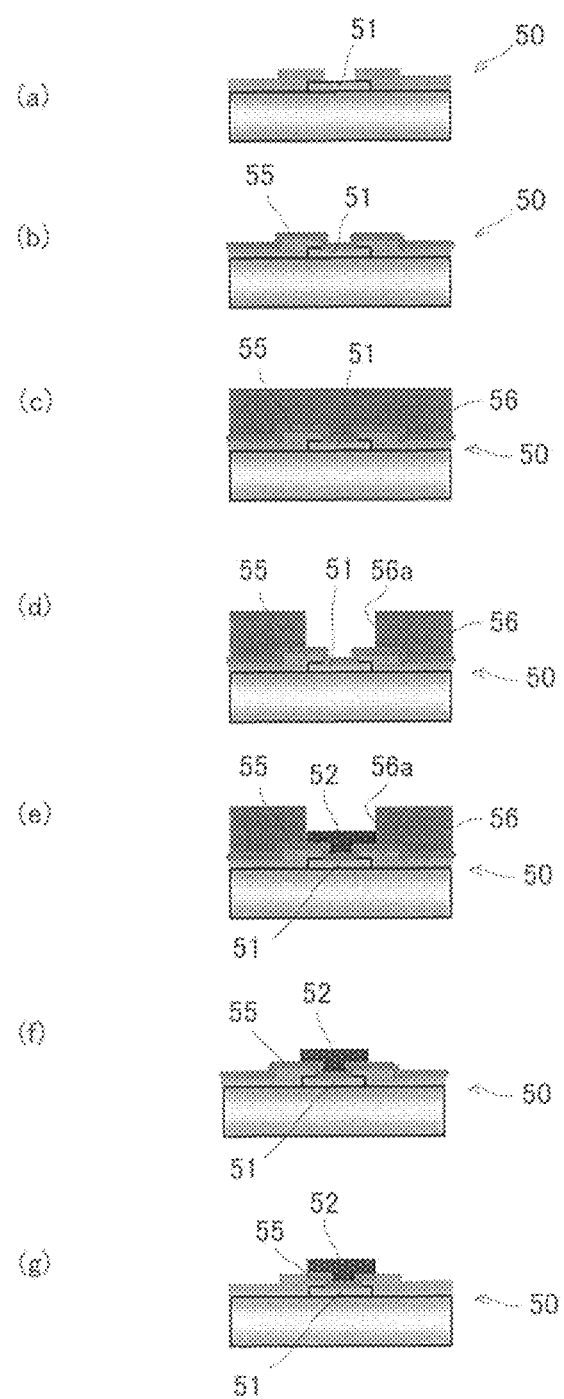
FIG. 7 A sectional view showing a production process for a semiconductor chip having a copper PAD and an adhesive layer.

Now will be described an exemplary production method for a semiconductor chip having a copper PAD with reference to FIG. 7.

As shown in FIG. 7(a), a semiconductor chip 50 having an aluminum PAD 51 is provided, and a seed metal layer 55 is disposed on the semiconductor chip 50 (FIG. 7(b)). Subsequently, a photosensitive resin layer 56 is disposed (FIG. 7(c)), and an opening 56a is provided above the aluminum PAD 51 through patterning (i.e., light exposure and development) (FIG. 7(d)). Thereafter, by means of electroplating, a copper PAD 52 is formed on a portion of the metal layer 55 exposed through the opening 56a (FIG. 7(e)). The photosensitive resin layer 56 is then removed (FIG. 7(f)), and the seed metal layer 55 is removed through soft etching, to thereby produce the semiconductor chip 50 having the copper PAD 52 (FIG. 7(g)).

The method for forming the copper PAD 52 is not limited to the aforementioned one. For example, the copper PAD 52 is not necessarily formed through copper plating, and may be formed through a method involving sputtering of a seed metal on the aluminum PAD 51, application of a copper paste onto the seed metal, and subsequent metallization. Alternatively, the copper PAD 52 may be formed through a method involving direct application of a copper paste onto the aluminum PAD 51, and subsequent metallization. In any case, the process is considerably simplified as compared with the case of InFO (involving formation of a columnar electrical connector) as described above in the background art section.

Now will be described a process for mounting the semiconductor chip 50 having the copper PAD 52 on the via wiring formation substrate 1 of the present invention. The via wiring formation substrate 1 of the present invention includes the support substrate 11, the releasable adhesive layer 12, and the first insulating layer 13 and the second insulating layer 14 disposed on the releasable adhesive layer 12, and having the via wiring formation vias 15 each penetrating only the first insulating layer 13 and the second insulating layer 14. The first insulating layer 13 is formed from an epoxy molding resin, and the second insulating layer 14 is formed of a non-flow adhesive layer (NFA).

The via wiring formation vias 15 each penetrating only the first insulating layer 13 and the second insulating layer 14 are provided so as to correspond to the positions of connection terminals of the semiconductor chip 50.

Figure 8:
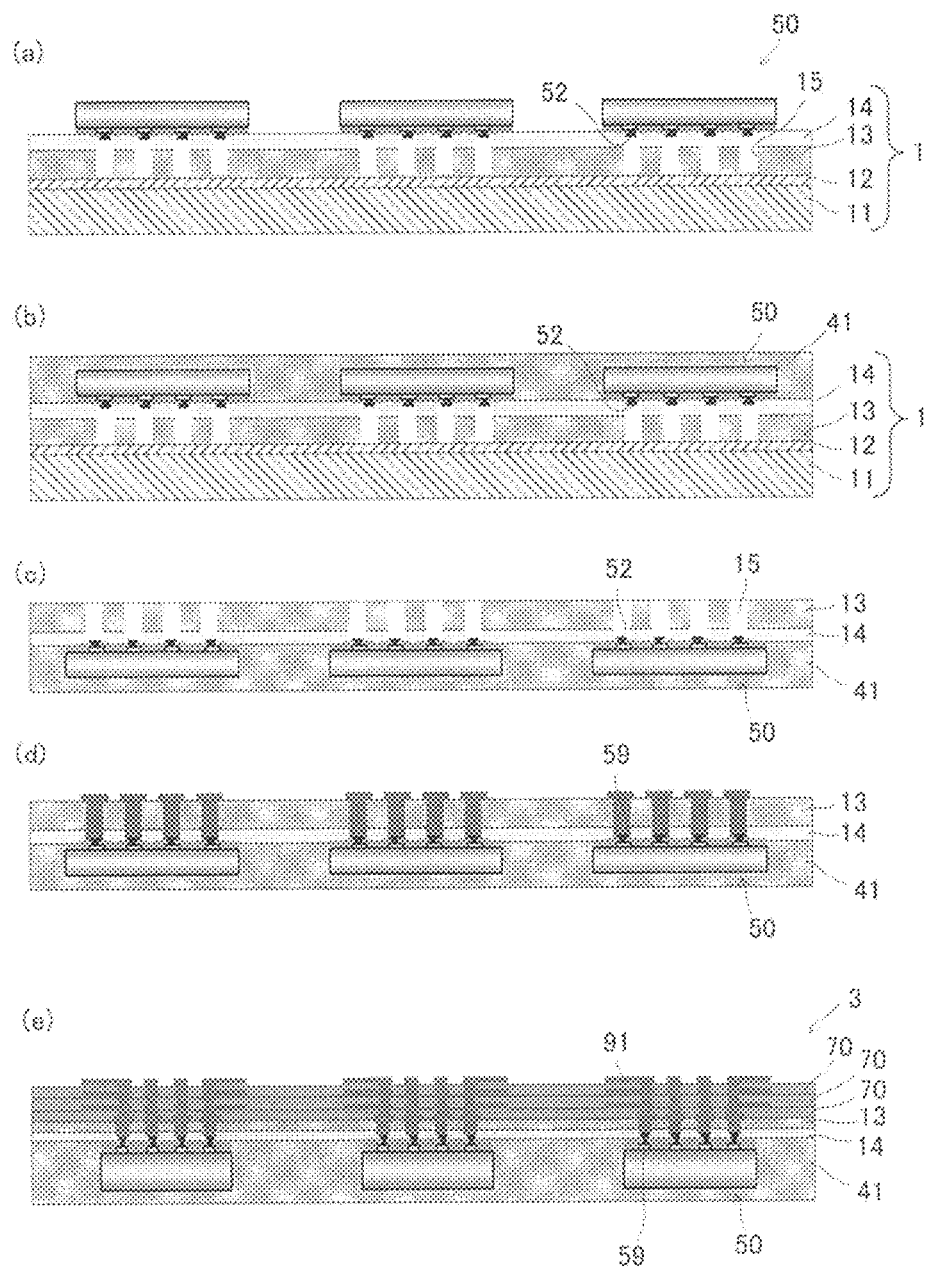
FIG. 8 A sectional view showing a production process for the via wiring formation substrate according to Embodiment 1.

While the copper PADs 52 are aligned with the via wiring formation vias 15, each semiconductor chip 50 is bonded to the second insulating layer 14 (NFA) (FIG. 8(a)). Specifically, the semiconductor chip 50 is temporarily bonded through a common technique under application of pressure and heating, and then completely bonded under application of pressure and heating while the whole alignment is performed.

Subsequently, a mold resin layer 41 is provided so as to embed the semiconductor chip 50 therein (FIG. 8(b)). The mold resin layer 41 may be formed from, for example, a mold resin prepared by mixing of a thermosetting resin (e.g., epoxy resin) with a filler. In particular, the mold resin layer 41 may be formed from an epoxy sealing resin. Since the mold resin layer 41 comes into direct contact with an active surface of the semiconductor chip 50, the mold resin layer 41 must be formed from a halogen-free material containing a small amount of an impurity. Since the mold resin layer 41 is not processed at small pitches, the mold resin layer 41 may be formed from a material containing a filler having a larger size than the filler contained in the resin material used in the first insulating layer 13. For example, the mold resin layer 41 may be formed from a thermosetting resin containing a filler having a maximum particle size of 5 μm to 50 μm.

After formation of the mold resin layer 41, a support substrate may be provided by the mediation of a releasable adhesive layer. This support substrate is provided for improving the handling performance after removal of the support substrate 11 in the next step. Although not shown in the drawings, this support substrate is removed in the final step for producing a product.

Subsequently, the support substrate 11 is removed by the mediation of the releasable adhesive layer 12 (FIG. 8(c)). When the releasable adhesive layer 12 is formed of "UV release tape SELFA-HW" (product of Sekisui Chemical Co., Ltd.), the support substrate 11 can be removed through UV irradiation.

Next, via wirings 59 are formed in the via wiring formation vias 15 through electroplating (FIG. 8(d)). Specifically, a chemical copper seed or a sputtering seed is provided in the via wiring formation vias 15, and then the via wirings 59 are formed through electroplating. The wiring layer formed on the surface of the insulating layer 13 is patterned into the via wirings 59 each having a predetermined size.

The via wirings 59 are not necessarily formed through electroplating. For example, the via wirings 59 may be formed by filling the via wiring formation vias 15 with an electroconductive paste containing copper.

Alternatively, the via wirings 59 may be formed through pattern plating. In the case of pattern plating, a copper seed layer is formed, a plating resist layer is formed through patterning, and the via wirings 59 are formed in the via wiring formation vias 15 through pattern electroplating by the mediation of the plating resist layer. Thereafter, the plating resist layer is removed, and the seed layer other than the underlayer of the via wirings 59 is removed through soft etching.

When the via wirings 59 are formed through pattern plating, the aluminum PAD 51 of the semiconductor chip 50 is not necessarily replaced with the copper PAD 52, and the aluminum PAD 51 of the semiconductor chip 50 may be used for mounting.

Subsequently, as shown in FIG. 8(e), a plurality of re-wiring layers 70 (three layers in FIG. 8(e)) are formed, by a common technique, on the insulating layer 13 having the via wirings 59 formed therein, to thereby produce a semiconductor chip-mounted component product 3. The semiconductor chip-mounted component product 3 is the semiconductor device-mounted component product of the present embodiment.

When the via wiring formation substrate 1 of the present invention is used, any type of semiconductor chip or functional component can be readily mounted, since the via wiring formation vias 15 can be formed at high accuracy so as to correspond to high-density connection terminals of the semiconductor chip or the functional component. In this case, a plurality of the semiconductor chips 50 or functional components are molded after bonding of the connection terminals to the via wiring formation substrate 1. Thus, even when the semiconductor chips 50 or the functional components have different heights, mounting is readily performed, which is advantageous.

Figure 9:
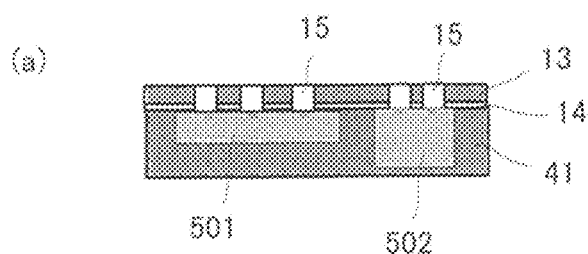
FIG. 9 A sectional view showing the effect of a mounting process according to Embodiment 1.
Figure 9:
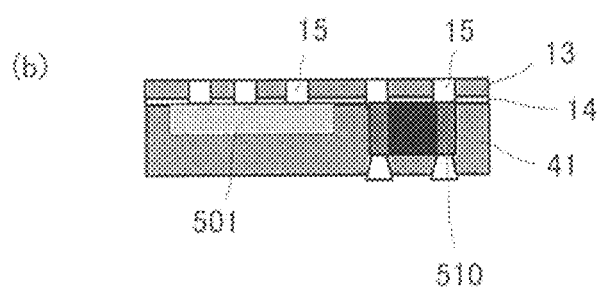

FIG. 9 shows such a mounting example. FIG. 9(a) shows the case where semiconductor chips 501 and 502 having different heights are mounted on the via wiring formation substrate 1 of the present invention. FIG. 9(b) shows the case where the semiconductor chip 501 and a passive component 510 are mounted. In any of these cases, the terminals of the semiconductor chip 501 or 502 or the passive component 510 are bonded to the via wiring formation substrate 1 of the present invention, and thus the semiconductor chip 501 or 502 or the passive component 510 causes no problems.

In the case of InFO described above in the background art section, a columnar electrical connector 108 and an electrical connector 112 on a semiconductor chip 110 are molded together, and then the top surfaces of the connectors must be exposed through grinding. This technique encounters difficulty in the case of high-density wiring, and encounters difficulty in connection of the connectors to a re-wiring layer. The upper limit of the height of the columnar electrical connector 108 is about 150 μm to about 200 μm. When the semiconductor chip 110 has a large height, difficulty may be encountered in production of a final product. In the case where a plurality of semiconductor chips are firstly mounted, when the semiconductor chips have different heights, the columnar electrical connector of one of the semiconductor chips must be lengthened, or another process is required, which is difficult to deal with.

In the via wiring formation substrate 1 of the present invention, the relatively rigid first insulating layer 13 is present between the re-wiring layer 70 and the semiconductor chip 50. Thus, even when a plurality of re-wiring layers 70 are disposed on the first insulating layer 13, occurrence of cracks is effectively prevented in the re-wiring layers 70. Meanwhile, the second insulating layer 14, which has elasticity lower than that of the first insulating layer 13, is present between the relatively rigid first insulating layer 13 and the semiconductor chip 50. Thus, even when a plurality of re-wiring layers 70 are disposed on the first insulating layer 13, occurrence of cracks is more effectively prevented in the re-wiring layers 70.

Component Mounting Embodiment 2

Next will be described an exemplary process for mounting a semiconductor chip on the via wiring formation substrate 1A with reference to the drawings.

In the via wiring formation substrate 1A, the outermost second insulating layer 14A is not a non-flow adhesive layer (NFA). Thus, an NFA must be provided on the semiconductor chip.

This process will be described with reference to FIG. 10.

Figure 10:
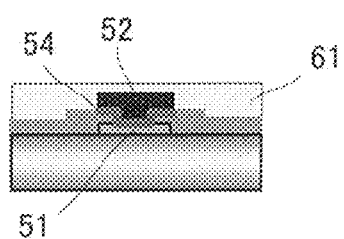
FIG. 10 A sectional view showing a production process for a semiconductor chip having a copper PAD and an adhesive layer.
Figure 10:
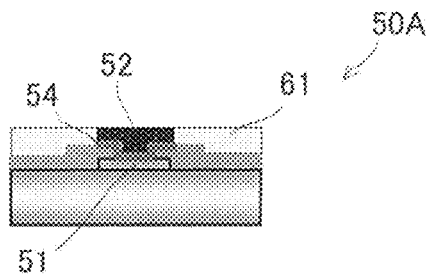

As shown in FIG. 10, the semiconductor chip 50 having the copper PAD 52 produced through the process shown in FIG. 9 is provided, and then an adhesive layer 61 is formed from a non-flow adhesive of relatively low fluidity so as to cover the copper PAD 52 (FIG. 10(a)). Thereafter, the top of the copper PAD 52 is exposed through grinding, to thereby produce a semiconductor chip 50A having the adhesive layer 61 (FIG. 10(b)).

Next will be described a process for mounting the semiconductor chip 50A onto the via wiring formation substrate 1A. While the copper PAD 52 is aligned with the via wiring formation via 15, the semiconductor chip 50A is bonded to the second insulating layer 14A by means of the adhesive layer 61 (FIG. 11(a)).

Subsequently, a mold resin layer 41 is provided so as to embed the semiconductor chip 50A therein (FIG. 11(b)). The mold resin layer 41 is the same as that used in the process shown in FIG. 8.

After formation of the mold resin layer 41, a support substrate may be provided by the mediation of a releasable adhesive layer. This support substrate is provided for improving the handling performance after removal of the support substrate 11 in the next step. Although not shown in the drawings, this support substrate is removed in the final step for producing a product.

Subsequently, the support substrate 11 is removed by the mediation of the releasable adhesive layer 12 (FIG. 11(c)). Specifically, when the releasable adhesive layer 12 is formed of "UV release tape SELFA-HW" (product of Sekisui Chemical Co., Ltd.), the support substrate 11 can be removed through UV irradiation.

Next, a via wiring is formed in the via wiring formation via 15 through electroplating. Specifically, a seed layer 57 formed of a chemical copper seed or a sputtering seed is provided in the via wiring formation via 15 (FIG. 11(d)), and then a wiring layer 58 containing the via wiring is formed through electroplating (FIG. 11(e)). The wiring layer 58 formed on the surface of the insulating layer 13 is patterned into the via wiring 59 having a predetermined size (FIG. 11(f)).

Figure 11:
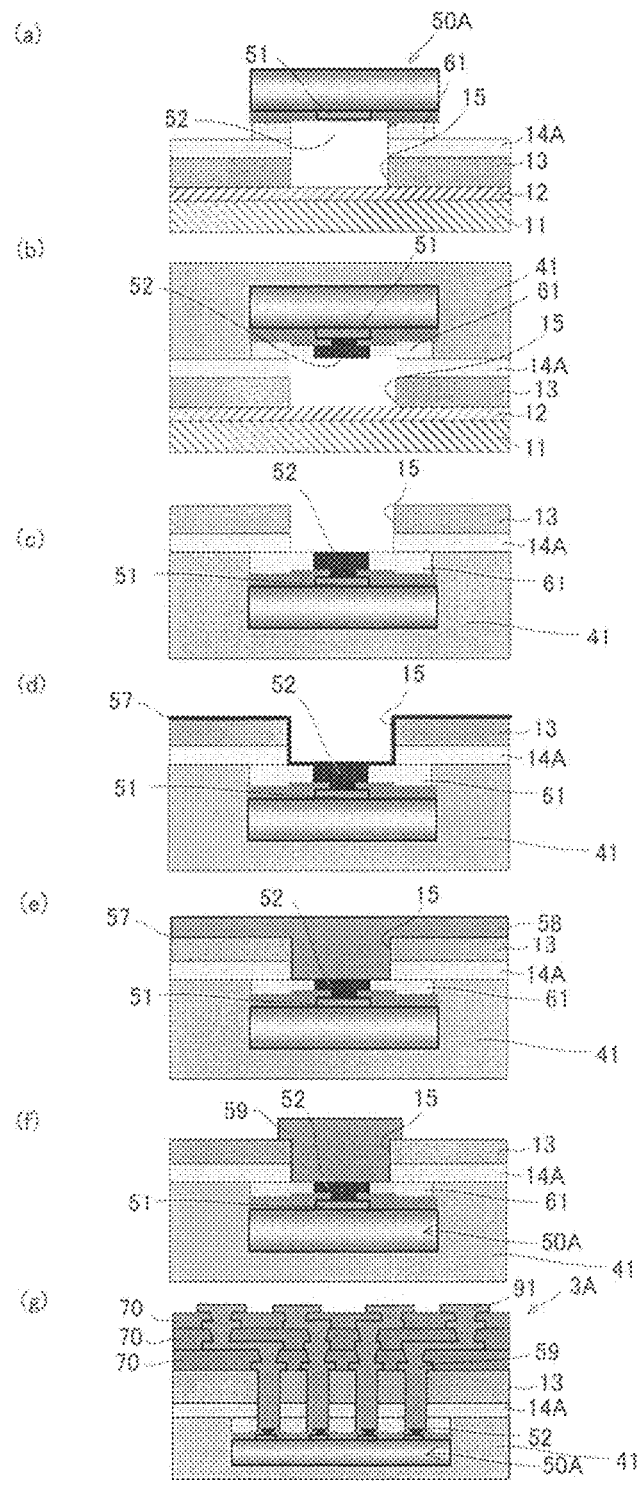
FIG. 11 A sectional view showing a mounting process according to Embodiment 2.

Subsequently, as shown in FIG. 11(g), a plurality of re-wiring layers 70 (three layers in FIG. 11(e)) are formed, by a common technique, on the second insulating layer 14A having the via wiring 59 formed therein, to thereby produce a semiconductor chip-mounted component product 3A having via wirings 91 formed on the surface thereof. The semiconductor chip-mounted component product 3A corresponds to the semiconductor device-mounted component product of the present embodiment. Each of the re-wiring layers 70 includes an insulating layer for re-wiring, a via wiring penetrating the insulating layer for re-wiring, and a wiring pattern provided on the insulating layer for re-wiring. The insulating layer for re-wiring is formed from a photosensitive resin (e.g., photosensitive polyimide resin) or a thermosetting resin. When a non-photosensitive resin is used, patterning (e.g., formation of through holes) is performed by means of, for example, laser machining.

Modification 1 of Component Mounting Embodiment

Figure 12:
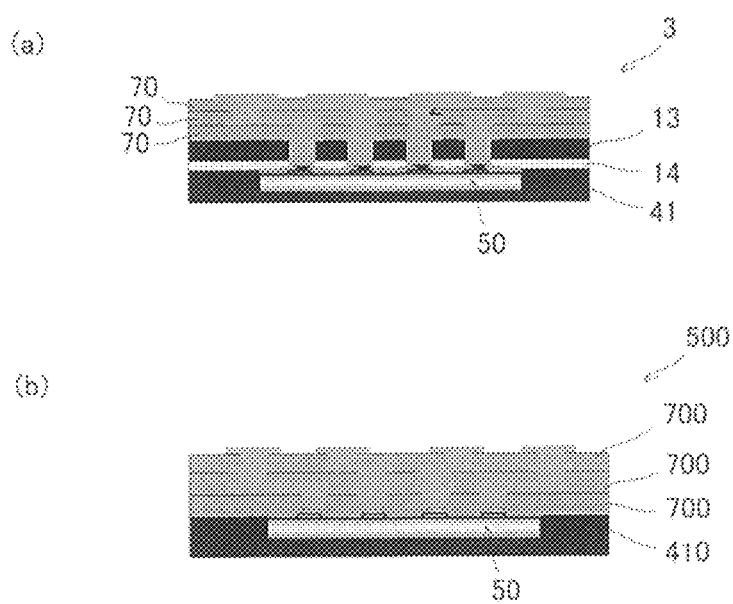
FIG. 12 A sectional view component product of the present showing comparison of the semiconductor chip-mounted component product of the present invention with a conventional eWLP structure.

FIG. 12 shows comparison between the semiconductor chip-mounted component product 3 of the present invention produced in Component Mounting Embodiment 1 or Component Mounting Embodiment 2 and a conventional eWLP (embedded wafer level package) structure.

In the conventional eWLP structure shown in FIG. 12(b), re-wiring layers 700 are provided directly on a mold resin layer 410 molding a semiconductor chip 50. Meanwhile, in the semiconductor chip-mounted component product 3 of the present invention shown in FIG. 12(a), the second insulating layer 14, which has relatively low elasticity, and the first insulating layer 13, which has relatively high elasticity and rigidity, are disposed, from the mold resin layer side, between the mold resin layer 41 and the re-wiring layers 70. Thus, occurrence of cracks is effectively prevented in the re-wiring layers 70.

The via wiring formation substrate 1 or 1A of Embodiment 1 or 2 can be used in various applications in addition to standard applications described in, for example, Embodiments 3 and 4.

Figure 13:
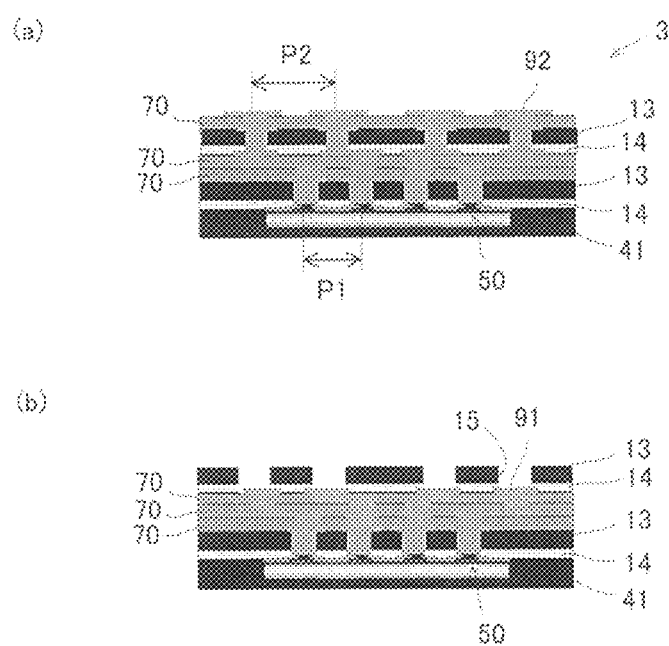
FIG. 13 A sectional view showing a modification of the semiconductor chip-mounted component of the present invention.

For example, as shown in FIG. 13(a), the second insulating layer 14 and the first insulating layer 13 may be provided by means of the via wiring formation substrate 1 between the plurality of the re-wiring layers 70 of the semiconductor chip-mounted component product 3 of Embodiment 3 or 4. Via wirings 92 are provided on the outermost surface. In this case, occurrence of cracks can be prevented in the re-wiring layers 70, and the number of disposed re-wiring layers 70 can be increased as compared with conventional cases. When, for example, three or four or more re-wiring layers 70 are disposed, cracks may occur in the re-wiring layers 70. However, when a component-receiving laminate including the second insulating layer 14 and the first insulating layer 13 is provided between the re-wiring layers 70, in particular, by virtue of the presence of the rigid first insulating layer 13, occurrence of cracks can be advantageously prevented.

When the number of the re-wiring layers 70 is increased, the pitches of via wirings can be advantageously augmented. In the case shown in FIG. 13(a), when the pitch P1 of the semiconductor chip 50 is, for example, about 40 μm to about 100 μm, the pitch P2 of the outermost surface can be increased to about 300 μm to about 500 μm.

As shown in FIG. 13(b), the second insulating layer 14 and the first insulating layer 13 may be disposed on the surface of the semiconductor chip-mounted component product 3 of Embodiment 3 or 4 by means of the via wiring formation substrate 1. These layers can be disposed in place of a solder resist that is generally provided on the surface of a mounted component. Such a modification can be achieved for the following reasons. Specifically, the component-receiving laminate can be greatly thinned, and the fine wiring structure can be dealt with in the same manner as in the case of a photosensitive solder resist because of high positional accuracy of through holes. Such a modification cannot be achieved by a machining process such as drilling or laser machining. Since the rigid first insulating layer 13 is present on the surface of the re-wiring layers 70, occurrence of cracks can be effectively prevented in the re-wiring layers 70. The via wiring formation vias 15 are used for connection with the via wirings 91.

Also, the via wiring formation substrate 1 or 1A of Embodiment 1 or 2 can be used in addition to a conventional mounted structure.

Figure 14:
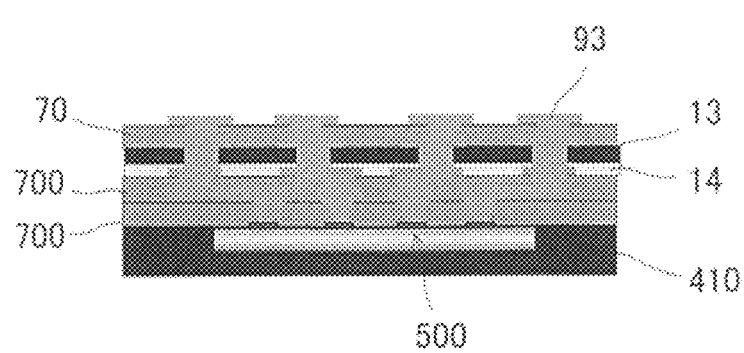
FIG. 14 A sectional view showing a modification of the semiconductor chip-mounted component product of the present invention.
Figure 14:
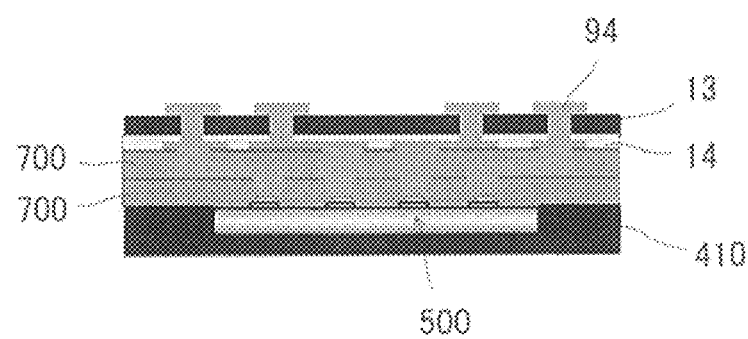
Figure 14:
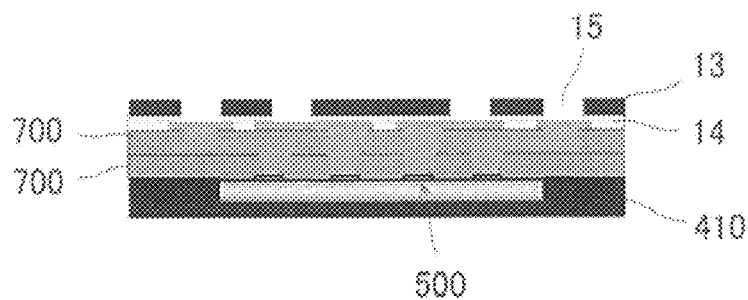

For example, as shown in FIG. 14(a), the via wiring formation substrate 1 may be used for providing the second insulating layer 14 and the first insulating layer 13 between a plurality of re-wiring layers 700 of conventional eWLP 500 (see FIG. 14(b)), and via wirings 93 may be formed by the mediation of a re-wiring layer 70 on the first insulating layer 13.

As shown in FIG. 14(b), the via wiring formation substrate 1 may be used for providing the second insulating layer 14 and the first insulating layer 13 on the surface of eWLP 500, to thereby form via wirings 94. Alternatively, as shown in FIG. 14(c), the via wiring formation substrate 1 may be used for providing the second insulating layer 14 and the first insulating layer 13 on the surface of eWLP 500, and the via wiring formation vias 15 may be used for connection with wiring terminals of the eWLP 500.

Instead of a semiconductor chip, for example, eWLP 500 (see FIG. 14(b)) may be mounted on the via wiring formation substrate 1 or 1A of Embodiment 1 or 2.

Figure 15:
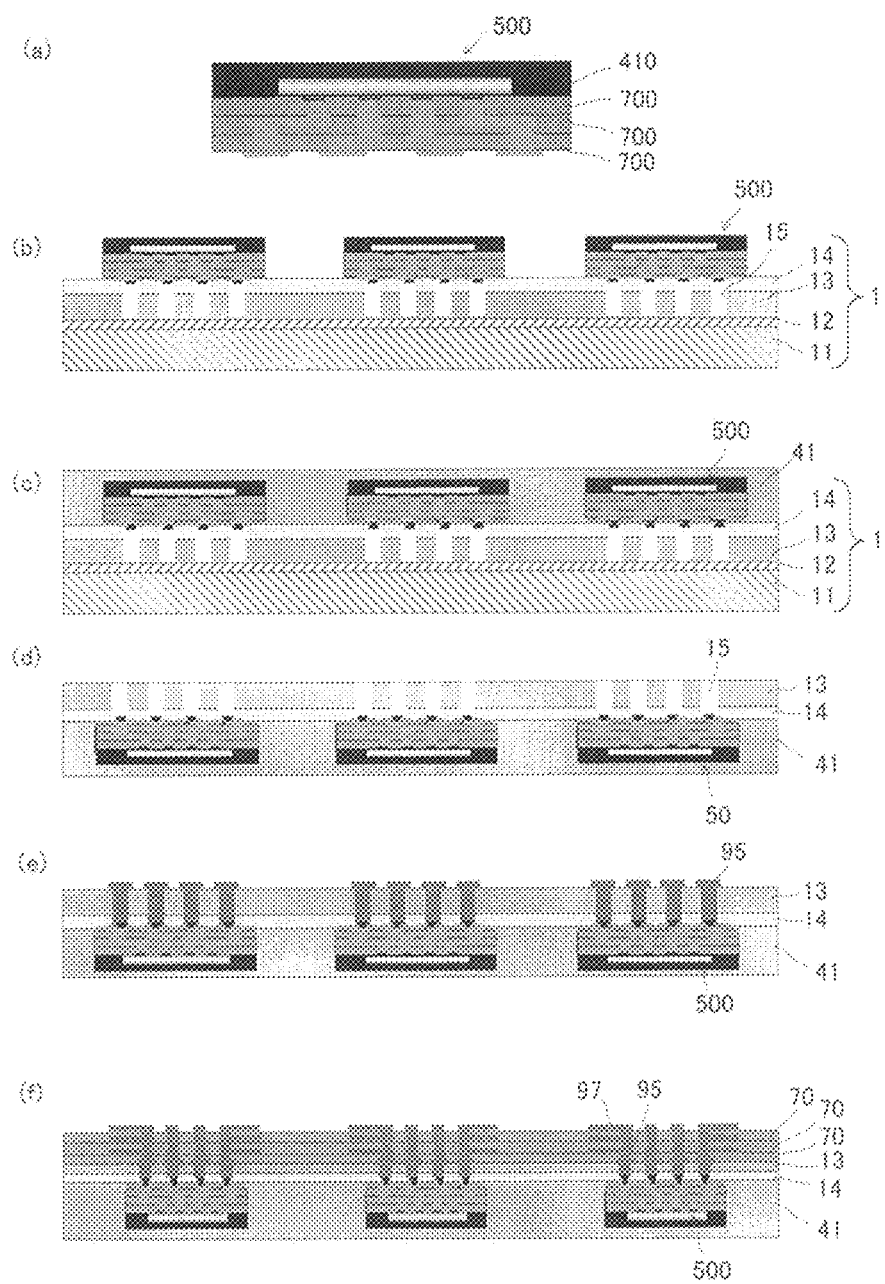
FIG. 15 A sectional view showing a modification of the semiconductor chip-mounted component product of the present invention.

FIG. 15 shows an example of such a production process. As shown in FIG. 15(a), eWLP 500 is provided and, as shown in FIG. 15(b), the eWLP 500 is mounted and bonded onto the via wiring formation substrate 1.

Subsequently, the eWLP 500 is molded with the mold resin layer 41 in the same manner as in the aforementioned embodiment (FIG. 15(c)).

After formation of the mold resin layer 41, a support substrate may be provided by the mediation of a releasable adhesive layer. This support substrate is provided for improving the handling performance after removal of the support substrate 11 in the next step. Although not shown in the drawings, this support substrate is removed in the final step for producing a product.

Subsequently, the support substrate 11 is removed by the mediation of the releasable adhesive layer 12 (FIG. 15(d)). Then, via wirings 95 are formed in the via wiring formation vias 15 through, for example, electroplating (FIG. 15(e)). Next, as shown in FIG. 15(f), a plurality of re-wiring layers 70 (three layers in FIG. 15(f)) are formed, by a common technique, on the insulating layer 13 having the via wirings 95 formed therein, to thereby produce a semiconductor chip-mounted component product having via wirings 97 formed on the outermost surface thereof.

Various semiconductor device-mounted component products have been described with reference to the semiconductor device mounting processes. In any case, the via wiring formation vias 15 and the copper PADs 52 are in one-to-one correspondence, and the via wiring 59 is formed so as to completely fill each via wiring formation via 15. However, the present invention is not limited to such a case.

Figure 16:
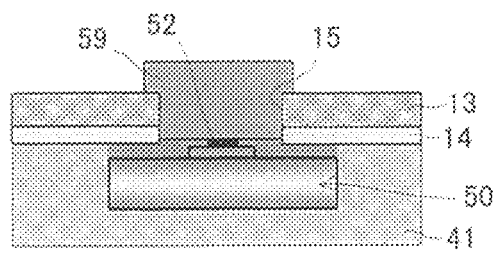
FIG. 16 A sectional view showing a modification of the semiconductor chip-mounted component product of the present invention.
Figure 16:
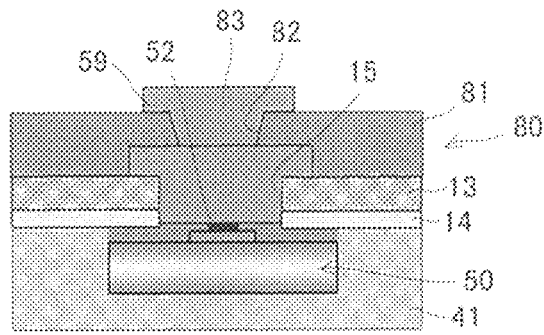

The characteristic features of the structures described above in the embodiments are summarized in FIG. 16. As shown in FIG. 16(a), each via wiring formation via 15 is provided so as to correspond to one copper PAD 52 of the semiconductor chip 50 molded with the mold resin layer 41, and the via wiring 59 is formed so as to fill the via wiring formation via 15. In this case, as shown in FIG. 16(b), the insulating layer for re-wiring 81, which is formed from, for example, a photosensitive resin or a thermosetting resin, is generally provided on the first insulating layer 13 including the via wiring 59, and the via wiring 83 to be connected with the via wiring 59 is formed in the through hole 82 provided in the insulating layer for re-wiring 81 at a position corresponding to the via wiring 59. In practice, a non-illustrated wiring to be connected with the via wiring 83 is formed on the insulating layer for re-wiring 81, to thereby form a re-wiring layer 80.

Figure 17:
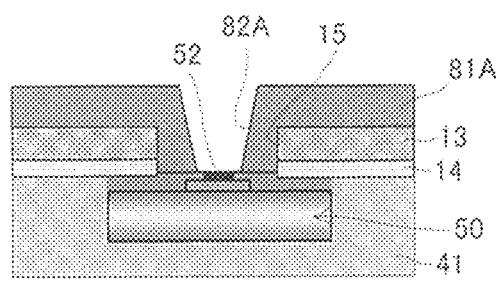
FIG. 17 A sectional view showing a modification of the semiconductor chip-mounted component product of the present invention.
Figure 17:
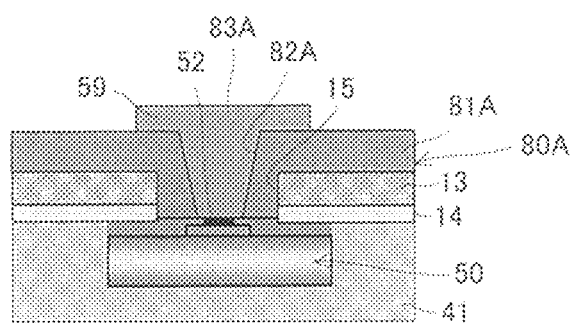

FIG. 17 shows another case where the via wiring formation vias 15 and the copper PADs 52 are in one-to-one correspondence. As shown in FIG. 17(a), the insulating layer for re-wiring 81A is formed on the circumference of the via wiring formation via 15 and on the first insulating layer 13, and a through hole 82A is provided in the insulating layer for re-wiring 81A at a position corresponding to the copper PAD 52. As shown in FIG. 17(*b*), the via wiring 83A to be connected with the copper PAD 52 is formed in the through hole 82A provided in the insulating layer for re-wiring 81A in the via wiring formation via 15. In practice, a non-illustrated wiring to be connected with the via wiring 83A is formed on the insulating layer for re-wiring 81A, to thereby form the re-wiring layer 80A.

FIGS. 16 and 17 show the cases where the via wiring formation vias 15 and the copper PADs 52 are in one-to-one correspondence. Meanwhile, FIGS. 18 and 19 show a case where the via wiring formation vias 15 and the copper PADs 52 are in one-to-many correspondence.

Figure 18:
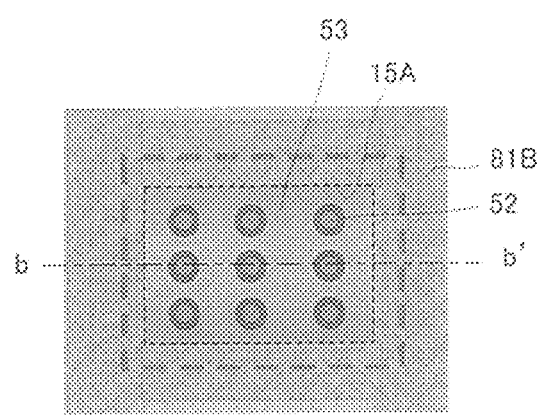
FIG. 18 A sectional view showing a modification of the semiconductor chip-mounted component product of the present invention.
Figure 18:
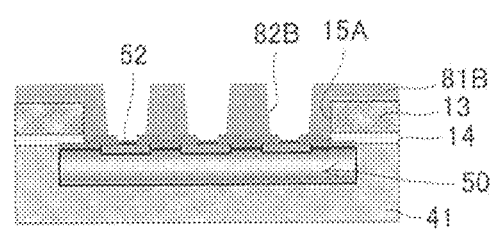
Figure 19:
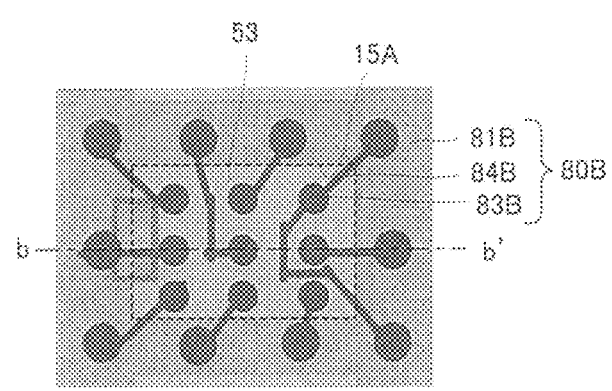
FIG. 19 A sectional view showing a modification of the semiconductor chip-mounted component product of the present invention.
Figure 19:
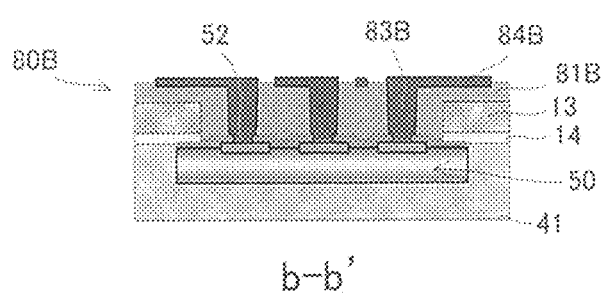

As shown in FIGS. 18 and 19, the semiconductor chip molded with the mold resin layer 41 is an area pad-type semiconductor chip 51A, and each via wiring formation via 15A is provided to have a shape corresponding to a rectangular area 53 in which a plurality of area pad-type copper PADs 52 are provided. FIG. 18 shows the state where an insulating layer for re-wiring is formed, and FIG. 19 shows the state where wirings are formed. FIG. 18(*a*) or 19(*a*) is a plan view, and FIG. 18(*b*) or 19(*b*) is a sectional view taken along line b-b' of FIG. 18(*a*) or 19(*a*).

As shown in these figures, an insulating layer for re-wiring 81B is formed on the first insulating layer 15 including the via wiring formation via 15A corresponding to the rectangular area 53, and through holes 82B are provided in the insulating layer for re-wiring 81B at positions corresponding to a plurality of copper PADs 52. Via wirings 83B to be connected with the copper PADs 52 are formed in the through holes 82B, and wirings 84B for re-wiring of the via wirings 83B are formed to thereby provide a re-wiring layer 80B. This is an example of the semiconductor device-mounted component product of the present invention.

Figure 20:
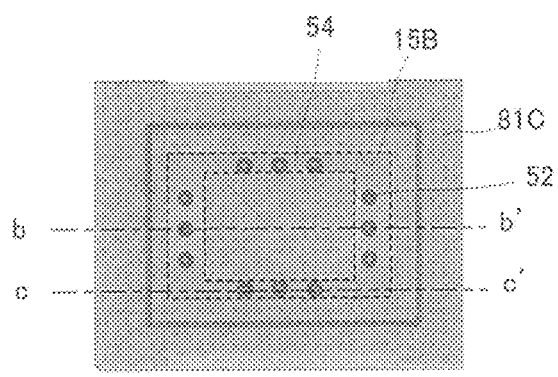
FIG. 20 A sectional view showing a modification of the semiconductor chip-mounted component product of the present invention.
Figure 20:
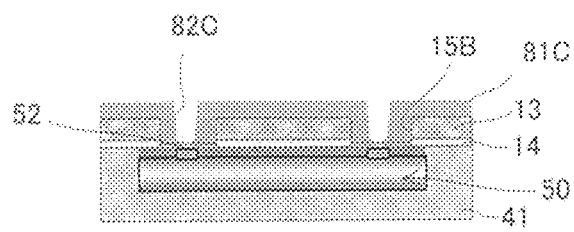
Figure 20:
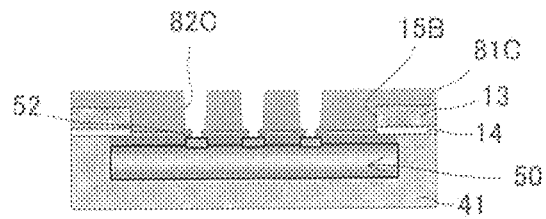
Figure 21:
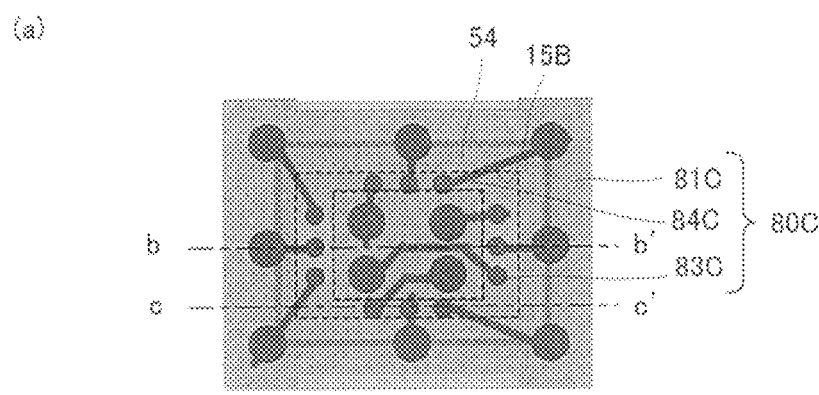
FIG. 21 A sectional view showing a modification of the semiconductor chip-mounted component product of the present invention.
Figure 21:
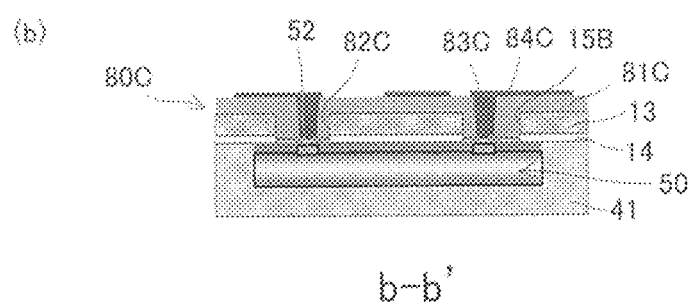
Figure 21:
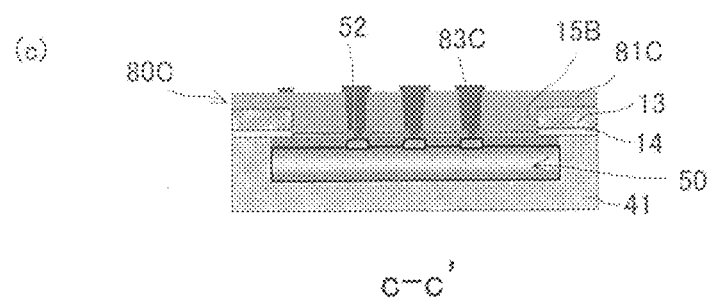

FIGS. 20 and 21 show another case where the via wiring formation vias 15 and the copper PADs 52 are in one-to-many correspondence.

As shown in FIGS. 20 and 21, the semiconductor chip molded with the mold resin layer 41 is a peripheral pad-type semiconductor chip 51B, and each via wiring formation via 15B is provided to have a shape corresponding to a rectangular doughnut-shaped peripheral area 54 in which a plurality of peripheral pad-type copper PADs 52 are provided. FIG. 20 shows the state where an insulating layer for re-wiring is formed, and FIG. 21 shows the state where wirings are formed. FIG. 20(*a*) or 21(*a*) is a plan view; FIG. 20(*b*) or 21(*b*) is a sectional view taken along line b-b' of FIG. 20(*a*) or 21(*a*); and FIG. 20(*c*) or 21(*c*) is a sectional view taken along line c-c' of FIG. 20(*a*) or 21(*a*).

As shown in these figures, an insulating layer for re-wiring 81C is formed on the first insulating layer 15 including the via wiring formation via 15B corresponding to the rectangular doughnut-shaped peripheral area 54, and through holes 82C are provided in the insulating layer for re-wiring 81C at positions corresponding to a plurality of copper PADs 52. Via wirings 83C to be connected with the copper PADs 52 are formed in the through holes 82C, and wirings 84C for re-wiring of the via wirings 83C are formed to thereby provide a re-wiring layer 80C. This is an example of the semiconductor device-mounted component product of the present invention.

Figure 22:
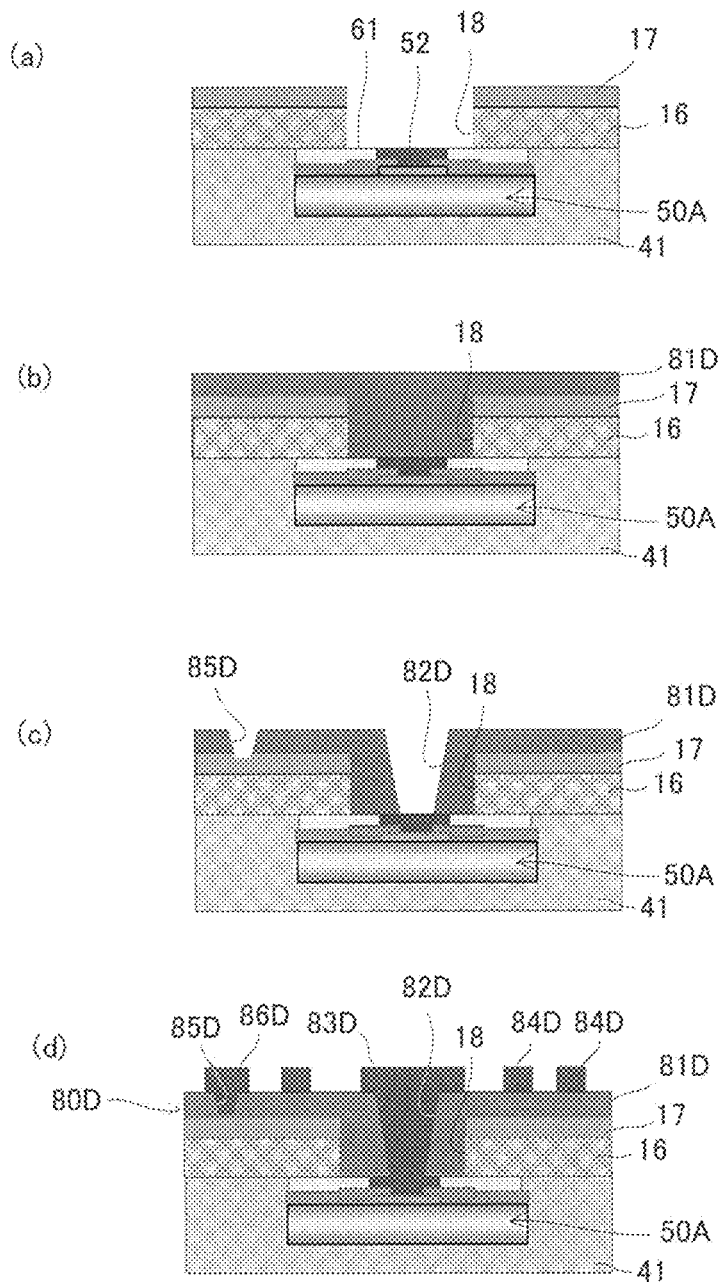
FIG. 22 A sectional view showing a modification of the semiconductor chip-mounted component product of the present invention.

FIG. 22 shows a mounting process for an example of the semiconductor device-mounted component product of the present invention. This example corresponds to a semiconductor device-mounted component product including the via wiring formation substrate 1B of Substrate Embodiment 3 (see FIG. 5).

FIG. 22(*a*) shows the state where the semiconductor chip 50A including the adhesive layer 61 shown in FIG. 10 is bonded to the via wiring formation substrate 1B, the semiconductor chip 50A is molded with the mold resin layer 41, and then the support substrate 1 is removed; i.e., the state where the semiconductor chip 50A is mounted on the component mounting laminate. Subsequently, as shown in FIG. 22(*b*), an insulating layer for re-wiring 81D is formed on a metal layer 17 having a via wiring formation via 18. Thereafter, as shown in FIG. 22(*c*), a through hole 82D is provided at a position corresponding to the copper PAD 52 so that the PAD 52 is exposed therethrough, and a ground through hole 85D is provided so that the metal layer 17 is exposed therethrough. Then, as shown in FIG. 22(*d*), a via wiring 83D to be connected with the copper PAD 52 is formed in the through hole 82D, and wirings 84D for re-wiring of the via wiring 83 are formed. Subsequently, a ground wiring 86D to be connected with the metal layer 17 is formed in the ground through hole 85D, to thereby form a re-wiring layer 80D including the second wiring 86D connected with the metal layer 17.

In such a semiconductor device-mounted component product, the metal layer 17 can be used as a shield layer for the ground wiring or the semiconductor chip, or employed as a heat spreading layer for heat release of the semiconductor chip.

Substrate Embodiment 4

Figure 23:
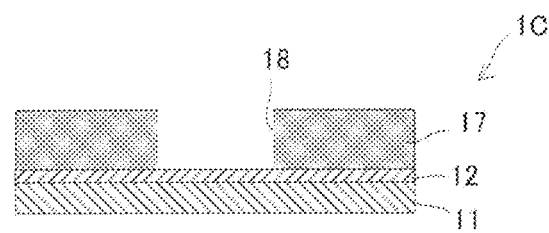
FIG. 23 A sectional view showing a via wiring formation substrate according to Substrate Embodiment 4.

With reference to FIG. 23, there has been described the via wiring formation substrate 1B including the support substrate 11, the releasable adhesive layer 12 disposed on one surface of the support substrate 11, and the metal layer 16 and the insulating layer 17 disposed on the releasable adhesive layer 12, and having the via wiring formation vias 18 each penetrating only the metal layer 16 and the insulating layer 17. Next will be described a modification of the via wiring formation substrate 1B, wherein the metal layer 16 is omitted.

Figure 24:
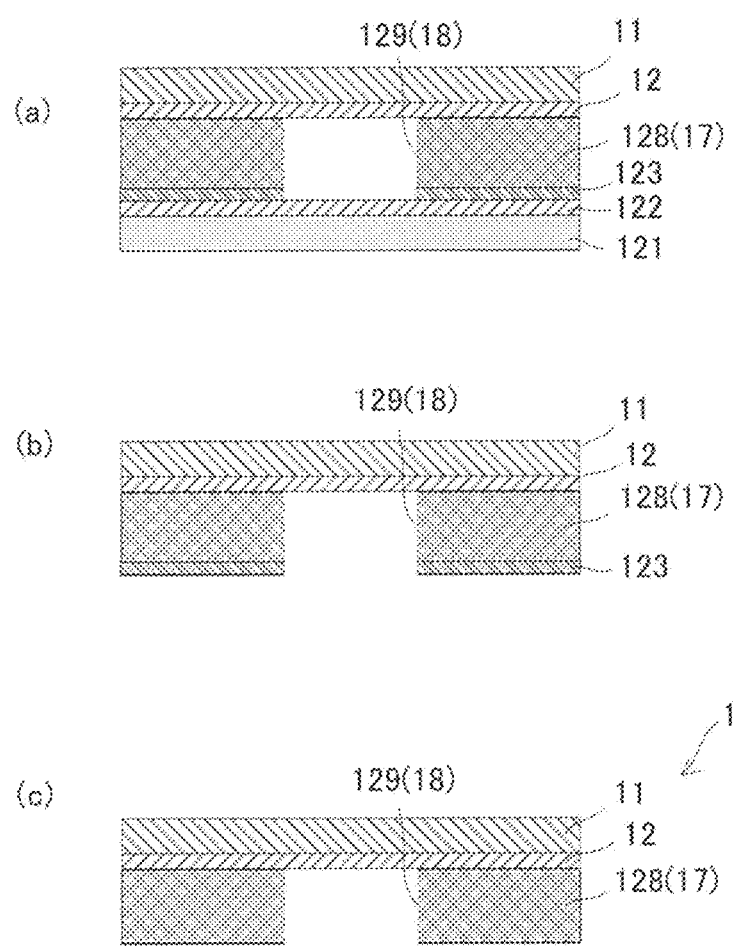
FIG. 24 A sectional view showing a production process for a via wiring formation substrate according to Substrate Embodiment 4.

FIG. 23 is a sectional view of a via wiring formation substrate according to Embodiment 2, and FIG. 24 is a sectional view showing a production process for the via wiring formation substrate.

As shown in FIG. 23, the via wiring formation substrate 1C includes a support substrate 11A, a releasable adhesive layer 12A disposed on one surface of the support substrate 11A, and an insulating layer 17 disposed on the releasable adhesive layer 12A. The via wiring formation substrate 1C has a plurality of via wiring formation vias 18 provided so as to penetrate only the insulating layer 17.

FIG. 24 shows a production process for the via wiring formation substrate 1A.

As shown in FIG. 24(*a*), firstly, the support substrate 11A is boned by the mediation of the releasable adhesive layer 12A on the side opposite the support substrate 11 after the step shown in FIG. 6(*i*). The support substrate 11A and the releasable adhesive layer 12A may be formed from the same materials as those used in the support substrate 11 and the releasable adhesive layer 12.

Subsequently, the support substrate 11 and the releasable adhesive layer 12 are removed (FIG. 24(*b*)). Then, the metal layer 123 and the metal column 127 are removed through etching, to thereby produce the via wiring formation substrate 1C (FIG. 24(c)).

Substrate Embodiment 5

Figure 25:
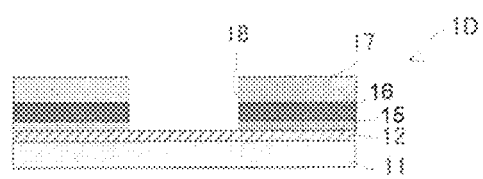
FIG. 25 A sectional view showing a via wiring formation substrate according to Substrate Embodiment 5.
Figure 26:
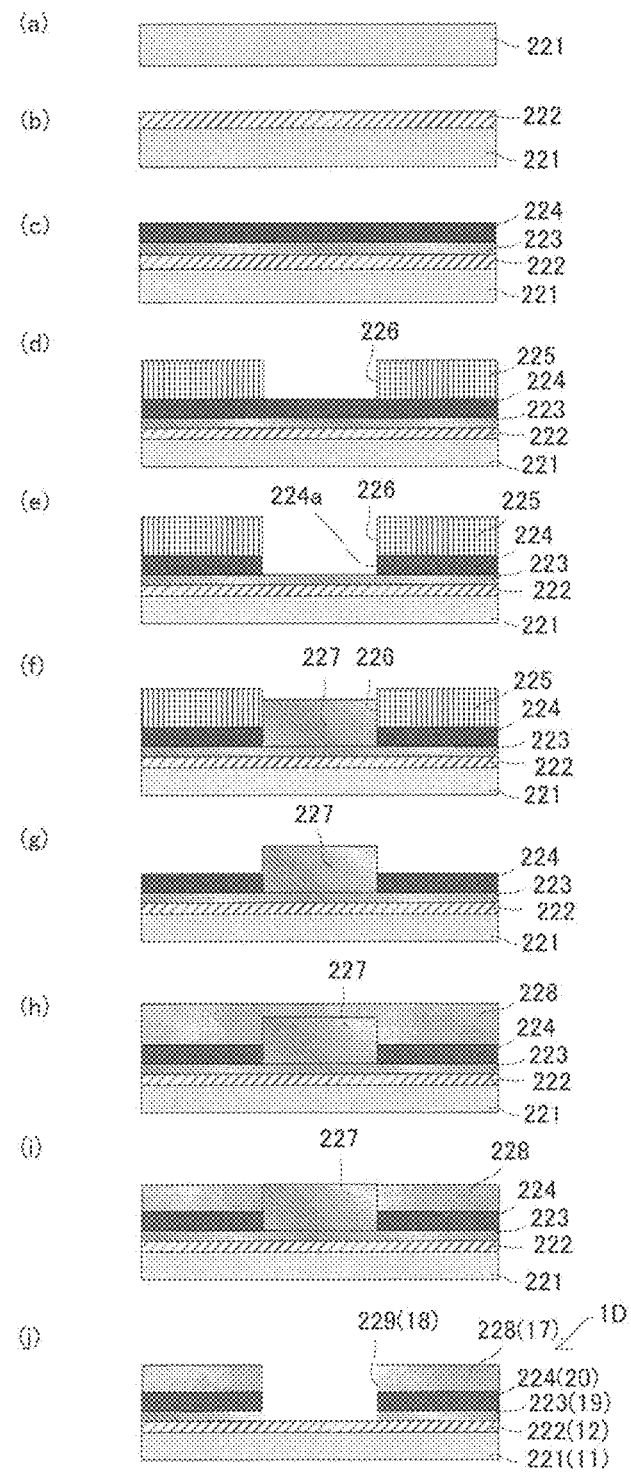
FIG. 26 A sectional view showing a production process for a via wiring formation substrate according to Substrate Embodiment 5.

FIG. 25 is a sectional view of a via wiring formation substrate according to Substrate Embodiment 5, and FIG. 26 is a sectional view showing a production process for the via wiring formation substrate.

The via wiring formation substrate 1D of the present embodiment includes a support substrate 11, a releasable adhesive layer 12 disposed on one surface of the support substrate 11, and two metal layers 19 and 20 and an insulating layer 17 disposed on the releasable adhesive layer 12. The via wiring formation substrate 1D has a plurality of via wiring formation vias 18 provided so as to penetrate only the metal layers 19 and 20 and the insulating layer 17.

The metal layer 20 can be used for formation of a wiring that can be connected with a via wiring formed after mounting of a semiconductor chip, and is provided for simplifying the process after mounting of the semiconductor chip. The metal layer 19 and the metal layer 20 preferably exhibit different etching characteristics. Preferably, only the metal layer 19 can be removed after mounting of the semiconductor chip while the metal layer 20 is retained. The metal layer 19 is preferably etched with an acidic etchant in consideration of the relationship between the metal layer 19 and a resist layer serving as a mask. Thus, when the metal layer 19 is formed of nickel, the metal layer 20 is preferably formed of copper in consideration that the metal layer 20 is used as a wiring layer.

Next will be described an exemplary production process for the via wiring formation substrate 1 with reference to FIG. 26.

Firstly, a support substrate 221 made of, for example, glass is provided (FIG. 26(a)), and a releasable adhesive layer 222 is disposed on one surface of the substrate 221 (FIG. 26(b)). The releasable adhesive layer 222 may be formed through coating or attaching a sheet-form adhesive layer. In this case, "UV release tape SELFA-SE" (product of Sekisui Chemical Co., Ltd.) is attached.

Subsequently, metal layers 223 and 224 are disposed on the releasable adhesive layer 222 (FIG. 26(c)). No particular limitation is imposed on the method for forming the metal layers 223 and 224, and the metal layers may be be formed through, for example, any vapor phase film formation process, film formation through plating, or attachment of a foil or a sheet. In consideration of working efficiency, the metal layers are preferably provided through attachment of a commercially available two-layer metal sheet.

In the present embodiment, a two-layer metal foil is attached so that the metal layer 223 is an Ni layer and the metal layer 224 is a Cu layer. In this case, the Ni metal layer 223 has a thickness of 0.5 μm, and the Cu metal layer 224 has a thickness of 3 μm. No particular limitation is imposed on the thickness of the metal layer 223, so long as the thickness is about 0.5 μm to about 5 μm. The thickness is not necessarily greater than this range. Meanwhile, the thickness of the metal layer 224 is adjusted to a thickness required for the wiring layer; for example, 3.5 μm to 10 μm.

Next, a resist layer 225 is formed on the metal layer 224, and an opening 226 having a predetermined pattern is provided so as to penetrate the resist layer 225 through photoresist patterning (i.e., a common technique) (FIG. 26(d)). The thickness of the resist layer 225 indirectly affects the thickness of the insulating layer 17 of the via wiring formation substrate 1, and the patterning characteristic of the resist layer 225 (i.e., the shape (diameter and verticality) of the opening 226) is transferred to the shape of the via wiring formation via 18. Thus, the resist resin forming the resist layer 225, which may be of positive or negative type, is preferably a resist resin satisfying the aforementioned required characteristics. Examples of preferred resist resins include "PHOTEC RY Series for PKG Board" (product of Hitachi Chemical Co., Ltd.).

In this case, the thickness of the resist layer 225 is adjusted to 35 μm, and the diameter of the opening 226 is adjusted to 30 μm.

The patterning is performed through light exposure (UV irradiation at 100 to 300 mJ/cm$^2$) and development (spraying of 1% $Na_2CO_3$ solution for 30 seconds).

Subsequently, the patterned resist layer 225 is used as a mask, and only a portion of the Cu metal layer 224 exposed through the opening 226 is etched, to thereby provide an opening 224a communicating with the opening 226 (FIG. 26(e)).

Next, the patterned resist layer 225 is used as a mask, and a nickel metal column 227 is formed through electroplating on a portion of the Ni metal layer 223 (serving as an electrode) exposed through the openings 226 and 224a (FIG. 26(f)). In this case, the metal layer 224, which is formed of copper (highly conductive metal), is disposed on the metal layer 223 and extends to the vicinity of the opening 226, which is advantageous in that the metal column 227 can be efficiently formed without causing a reduction in voltage for metal plating.

In this embodiment, the thickness of the metal column 227 is 25 μm. The thickness of the metal column 227 directly relates to the aforementioned depth of the via wiring formation via 18, and thus the thickness of the metal column 227 is determined depending on the required depth.

Subsequently, the resist layer 225 is removed (FIG. 26(g)), and a mold resin 228 to become the insulating layer 17 is applied (FIG. 26(h)). Thereafter, the mold resin 228 is ground so as to expose the top surface (first end surface) of the metal column 227 covered with the mold resin 228 (FIG. 26(i)).

The mold resin 228 may be a resin material to become the aforementioned insulating layer 17. The thickness of the mold resin is adjusted so as to cover the metal column 227. No particular limitation is imposed on the method for application of the mold resin 228, and the mold resin 228 can be applied through, for example, vacuum printing, film lamination, or compression molding using a mold. In this embodiment, a mold resin (R4212, product of Nagase ChemteX Corporation) is used, and the first mold resin 228 is formed through compression molding (120° C., 10 min) and curing (post-cure conditions: 150° C., 1 h).

The grinding for exposure of the top surface of the metal column 227 can be performed by means of a common grinder such as diamond bite.

Next, the metal column 227 and a portion of the metal layer 223 are removed through etching, to thereby provide a via wiring formation via 229 to become the via wiring formation via 18 of the via wiring formation substrate 1 (FIG. 26(j)). This process produces the via wiring formation substrate 1D including the support substrate 11, the releasable adhesive layer 12, and the metal layers 19 and 20 and insulating layer 17 disposed on the releasable adhesive layer 12, and having the via wiring formation vias 18 each penetrating only the metal layers 19 and 20 and the insulating layer 17 (see FIG. 25).

Modification 2 of Component Mounting Embodiment

Next will be described an exemplary process for mounting a semiconductor chip on each of the via wiring formation substrates 1B to 1D with reference to the drawings.

In this embodiment, the semiconductor chip 50A including the adhesive layer shown in FIG. 10 is mounted.

Now will be described a process for mounting the semiconductor chip 50A having the copper PAD 52 and the adhesive layer 61 on the via wiring formation substrate 1B of the present invention. The via wiring formation substrate 1B of the present invention includes the support substrate 11, the releasable adhesive layer 12, and the metal layer 16 and insulating layer 17 disposed on the releasable adhesive layer 12, and having the via wiring formation vias 18 each penetrating only the metal layer 16 and the insulating layer 17.

Subsequently, while the copper PAD 52 is aligned with the via wiring formation via 18, the semiconductor chip 50A is bonded to the insulating layer 17 by means of the adhesive layer 61 (FIG. 27(a)). Specifically, each semiconductor chip 50 is temporarily bonded by a common technique under application of pressure and heating while alignment is performed, and then completely bonded under application of pressure and heating while the whole alignment is performed.

Figure 27:
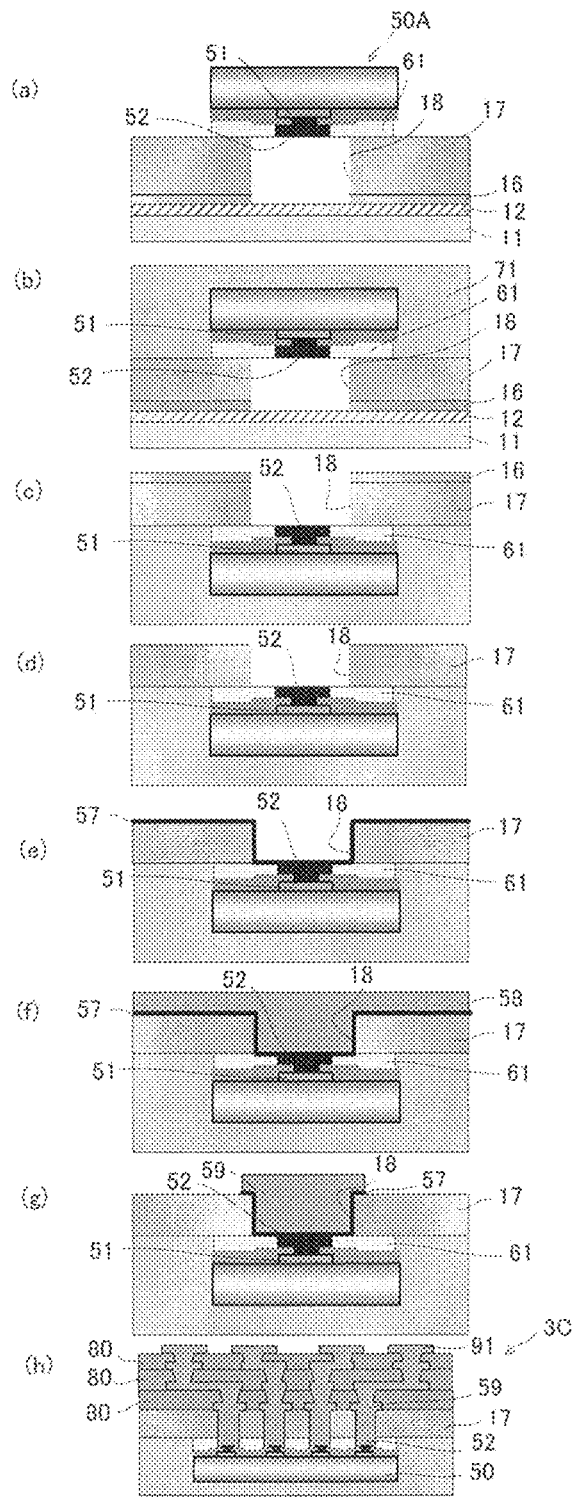
FIG. 27 A sectional view showing a modification of the semiconductor chip-mounted component product of the present invention.

Next, a mold resin layer 71 is provided so as to embed the semiconductor chip 50 therein (FIG. 27(b)). The mold resin layer 71 may be formed from, for example, a mold resin prepared by mixing of a thermosetting resin (e.g., epoxy resin) with a filler. In particular, the mold resin layer 71 may be formed from an epoxy sealing resin. Since the mold resin layer 71 comes into direct contact with an active surface of the semiconductor chip 50A, the mold resin layer 71 must be formed from a halogen-free material containing a small amount of an impurity. Since the mold resin layer 71 is not processed at small pitches, the mold resin layer 71 may be formed from a material containing a filler having a larger size than the filler contained in the resin material used in the insulating layer 17. For example, the mold resin layer 71 may be formed from a thermosetting resin containing a filler having a maximum particle size of 30 μm to 50 μm.

After formation of the mold resin layer 71, a support substrate may be provided by the mediation of a releasable adhesive layer. This support substrate is provided for improving the handling performance after removal of the first support substrate 11 in the next step. Although not shown in the drawings, this support substrate is removed in the final step for producing a product.

Subsequently, the support substrate 11 is removed by the mediation of the releasable adhesive layer 12 (FIG. 27(c)). Specifically, when the releasable adhesive layer 12 is formed of "UV release tape SELFA-SE" (product of Sekisui Chemical Co., Ltd.), the support substrate 11 can be removed through UV irradiation.

Next, for example, the Ni metal layer 16 is removed through etching (FIG. 27(d)). Since the metal layer 16 is formed of Ni, the metal layer 16 can be etched with an acidic etchant such as hydrochloric acid solution, sulfuric acid, or sulfuric acid-hydrogen peroxide ($H_2SO_4$—$H_2O_2$) without affecting the copper PAD 52.

Subsequently, a via wiring is formed in the via wiring formation via 18 through electroplating. Specifically, a seed layer 57 formed of a chemical copper seed or a sputtering seed is provided in the via wiring formation via 18 (FIG. 27(e)), and then a wiring layer 58 containing the via wiring is formed through electroplating (FIG. 27(f)). The wiring layer 58 formed on the surface of the insulating layer 17 is patterned into the via wiring 59 having a predetermined size (FIG. 27(g)).

Thereafter, as shown in FIG. 27(h), a plurality of re-wiring layers 80 (three layers in FIG. 27(h)) are formed, by a common technique, on the insulating layer 17 having the via wiring 59 formed therein, to thereby produce a semiconductor chip-mounted component product 3C. Each of the re-wiring layers 80 includes an insulating layer, a via wiring penetrating the insulating layer, and a wiring pattern 91 provided on the insulating layer. The insulating layer is formed from a photosensitive resin (e.g., photosensitive polyimide resin) or a thermosetting resin.

FIGS. 27(a) to 27(g) show only one connection terminal 51 of the semiconductor chip 50A, and FIG. 27(h) shows a plurality of connection terminals 51. A plurality of semiconductor chips 50A may be disposed on one via wiring formation substrate 1, and the semiconductor chip 50 may be mounted together with an additional functional component.

In any case, when the via wiring formation substrate 1 of the present invention is used, any type of semiconductor chip or functional component can be readily mounted, since the via wiring formation vias 18 can be formed at high accuracy so as to correspond to high-density connection terminals of the semiconductor chip or the functional component. In this case, a plurality of the semiconductor chips 50 or functional components are molded after bonding of the connection terminals to the via wiring formation substrate 1. Thus, even when the semiconductor chips 50A or the functional components have different heights, mounting is readily performed, which is advantageous.

Figure 28:
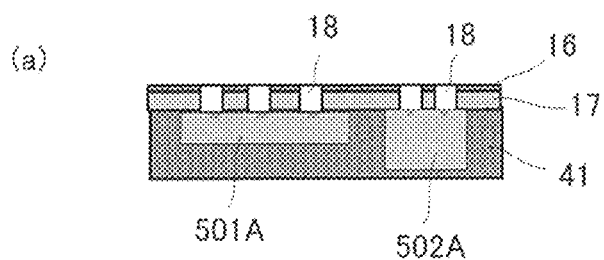
FIG. 28 A sectional view showing a modification of the semiconductor chip-mounted component product of the present invention.
Figure 28:
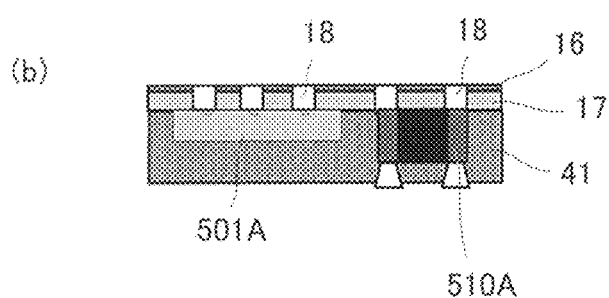

FIG. 28 shows such a mounting example. FIG. 28(a) shows the case where semiconductor chips 501A and 502A having different heights are mounted on the via wiring formation substrate 1 of the present invention. FIG. 28(b) shows the case where the semiconductor chip 501A and a passive component 510A are mounted. In any of these cases, the terminals of the semiconductor chip 501A or 502A or the passive component 510 are bonded to the via wiring formation substrate 1 of the present invention, and thus the semiconductor chip 501A or 502A or the passive component 510A causes no problems.

In contrast, in the case of InFO described above in the background art section, a columnar electrical connector 108 and an electrical connector 112 on a semiconductor chip 110 are molded together, and then the top surfaces of the connectors must be exposed through grinding. This technique encounters difficulty in the case of high-density wiring, and encounters difficulty in connection of the connectors to a re-wiring layer. The upper limit of the height of the columnar electrical connector 108 is about 150 to about 200 μm. When the semiconductor chip 110 has a large height, difficulty may be encountered in production of a final product. In the case where a plurality of semiconductor chips are firstly mounted, when the semiconductor chips have different heights, the electrical connector of one of the semiconductor chips must be formed into a columnar shape, or another process is required, which is difficult to deal with.

Notably, the method for mounting a semiconductor chip on the via wiring formation substrate 1A is performed in the same manner as in the aforementioned case, except that a step of removing the metal layer 13 is not performed. Thus, detailed description of the method is omitted.

Modification 3 of Component Mounting Embodiment

Figure 29:
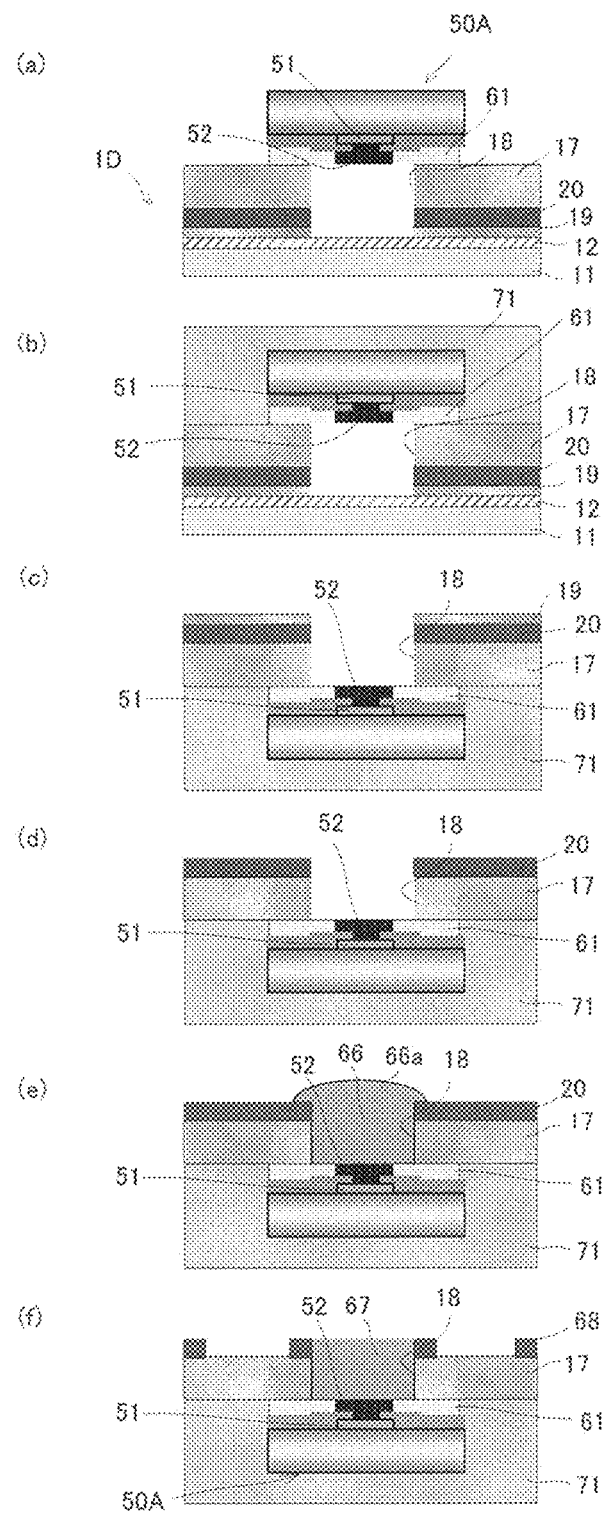
FIG. 29 A sectional view showing a modification of the semiconductor chip-mounted component product of the present invention.

Next will be described another exemplary process for mounting a semiconductor chip on the via wiring formation substrate 1D with reference to FIG. 29.

Firstly, the via wiring formation substrate 1D of the present invention is provided. The via wiring formation substrate 1D includes the support substrate 11, the releasable adhesive layer 12, the metal layers 19 and 20 and the insulating layer 17 disposed on the releasable adhesive layer 12, and has the via wiring formation vias 18 each penetrating only the metal layers 19 and 20 and the insulating layer 17.

Subsequently, while the copper PAD 52 is aligned with the via wiring formation via 18, the semiconductor chip 50A is bonded to the insulating layer 17 by means of the adhesive layer 61 (FIG. 29(a)).

Next, a mold resin layer 71 is provided so as to embed the semiconductor chip 50A therein (FIG. 29(b)). The mold resin layer 71 may be formed from, for example, a mold resin prepared by mixing of a thermosetting resin (e.g., epoxy resin) with a filler. In particular, the mold resin layer 71 may be formed from an epoxy sealing resin.

Subsequently, the support substrate 11 is removed by the mediation of the releasable adhesive layer 12 (FIG. 29(c)). Specifically, when the releasable adhesive layer 12 is formed of "UV release tape SELFA-SE" (product of Sekisui Chemical Co., Ltd.), the support substrate 11 can be removed through UV irradiation.

Next, for example, the Ni metal layer 19 is removed through etching (FIG. 29(d)). Since the metal layer 19 is formed of Ni, the metal layer 19 can be etched with an acidic etchant such as hydrochloric acid solution, sulfuric acid, or sulfuric acid-hydrogen peroxide ($H_2SO_4$—$H_2O_2$) without affecting the copper PAD 52.

Subsequently, a via wiring is formed in the via wiring formation via 18 through electroplating. Specifically, in the present embodiment, the via wiring formation via 18 is filled with an electroconductive paste containing copper, to thereby form a via wiring 66 (FIG. 29(e)). Needless to say, as described above, the via wiring may be formed by providing a chemical copper seed or a sputtering seed in the via wiring formation via 18, followed by electroplating.

Thereafter, a protruded portion 66a of the via wiring 66 is ground (FIG. 29(f)), and the metal layer 14 on the insulating layer 17 is subjected to predetermined patterning, to thereby form a via wiring 67 and a necessary wiring pattern 68. The protruded portion 66a of the via wiring 66 may be retained as is. This is advantageous in that more reliable conduction is achieved between the via wiring and the surface wiring layer.

The next and subsequent steps are the same as in the aforementioned embodiment; i.e., a plurality of re-wiring layers are formed by a common technique on the insulating layer 17 having thereon the via wiring 67 and the wiring pattern 68, to thereby produce a semiconductor chip-mounted component product.

In the present embodiment, wirings can be directly formed on the insulating layer 17, which is advantageous in that one re-wiring layer can be omitted. Other effects are similar to those achieved by the embodiment described above.

When the via wiring formation substrate 1D including the insulating layer 17 formed of such a filler-containing mold resin and the copper metal layer 20 disposed below the insulating layer 17 is used, the copper metal layer 20 present on the insulating layer 17 can be used for, for example, a wiring as appropriate after removal of the support substrate 11 following the mounting process, which is greatly advantageous. Since the filler-containing insulating layer 17 exhibits poor surface smoothness, difficulty is encountered in forming and fine processing of a wiring layer due to poor adhesion between the wiring layer and the insulating layer 17. However, in the aforementioned modification, the wiring layer is present during formation of the insulating layer 17, and thus a good adhesion can be achieved between these layers, resulting in fine processing of the wiring layer. Therefore, this modification can be used in various applications. Some examples thereof will be described below.

Modification 4 of Component Mounting Embodiment

Figure 30:
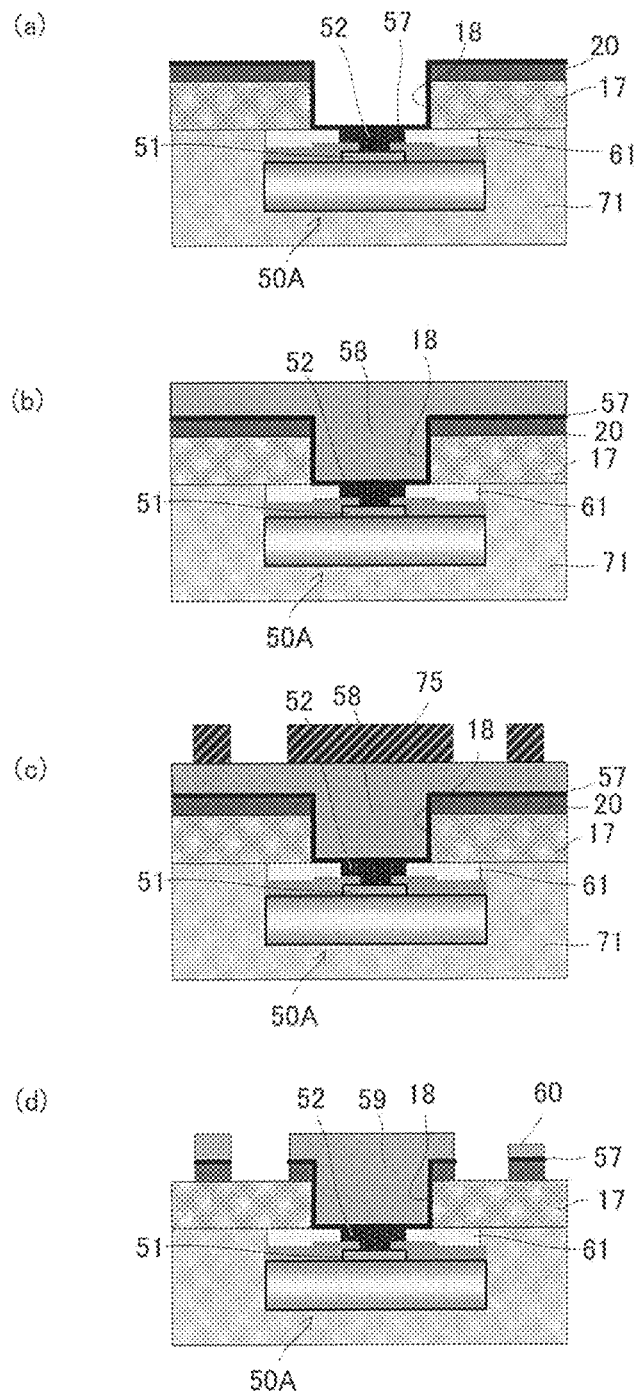
FIG. 30 A sectional view showing a modification of the semiconductor chip-mounted component product of the present invention.

Next will be described another exemplary process for mounting a semiconductor chip on the via wiring formation substrate 1D with reference to FIG. 30. This process includes the same steps as those described in Modification 3 of Component Mounting Embodiment with reference to FIGS. 29(a) to 29(d). Thus, subsequent steps will be described.

Firstly, as shown in FIG. 30(a), a seed layer 57 is provided, and then the via wiring formation via 18 is embedded through electroplating, to thereby form a wiring layer 58 (FIG. 30(b)).

Subsequently, a resist layer is provided, and then a resist layer 75 is formed through patterning (FIG. 30(c)). Then, the wiring layer 58 and the metal layer 14 are subjected to patterning, to thereby form a via wiring 59 and a wiring 60 (FIG. 30(d)).

Figure 31:
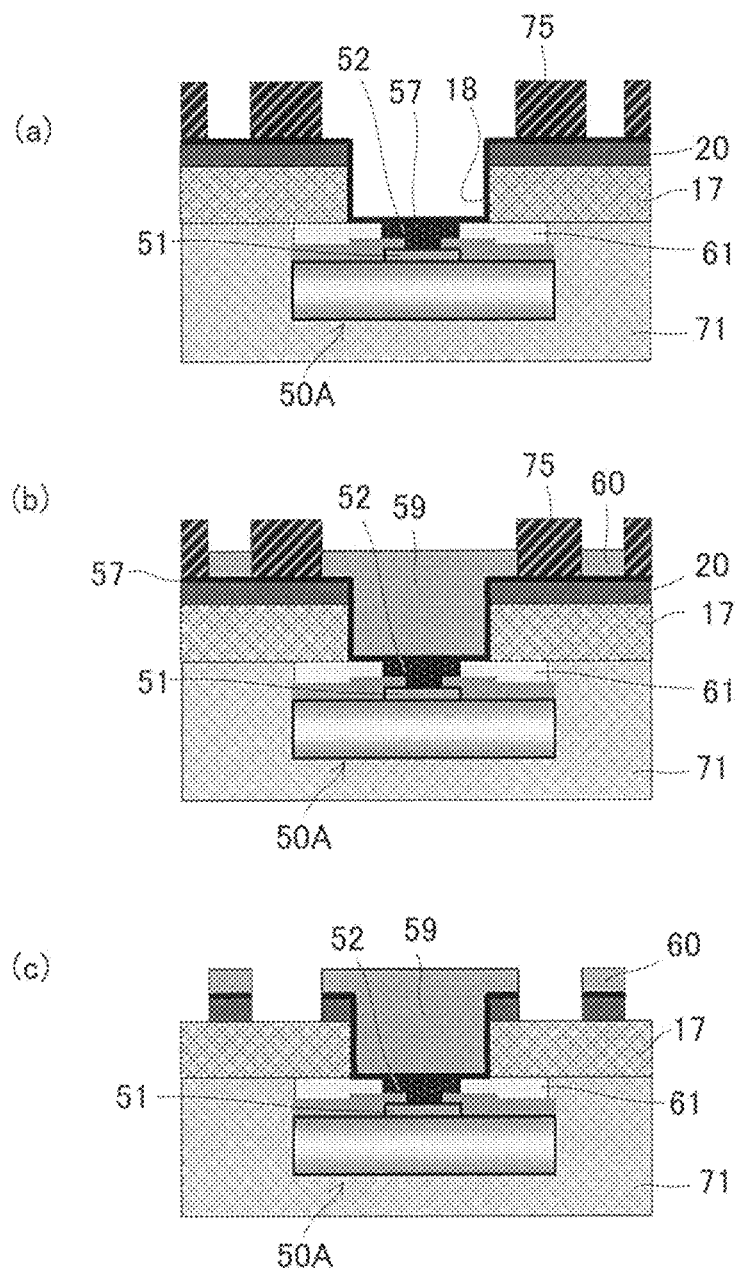
FIG. 31 A sectional view showing a modification of the semiconductor chip-mounted component product of the present invention.

The process for forming the wiring 60 is not limited to the aforementioned one, and, for example, the wiring 60 may be formed as shown in FIG. 31.

FIG. 31 shows step subsequent to the steps shown in FIGS. 29(a) to 29(d) in Embodiment 5. As shown in FIG. 31(a), a seed layer 57 is provided, and then a previously provided resist layer is subjected to patterning, to thereby form a resist layer 75. Thereafter, the via wiring formation via 18 is embedded through electroplating, to thereby form a via wiring 59 and a wiring 60 (FIG. 31(b)). Finally, the resist layer 75, the seed layer 57 below the resist layer 75, and the metal layer 14 are removed (FIG. 31(c)).

The effects achieved by the present embodiment are similar to those described above.

Modification 5 of Component Mounting Embodiment

Figure 32:
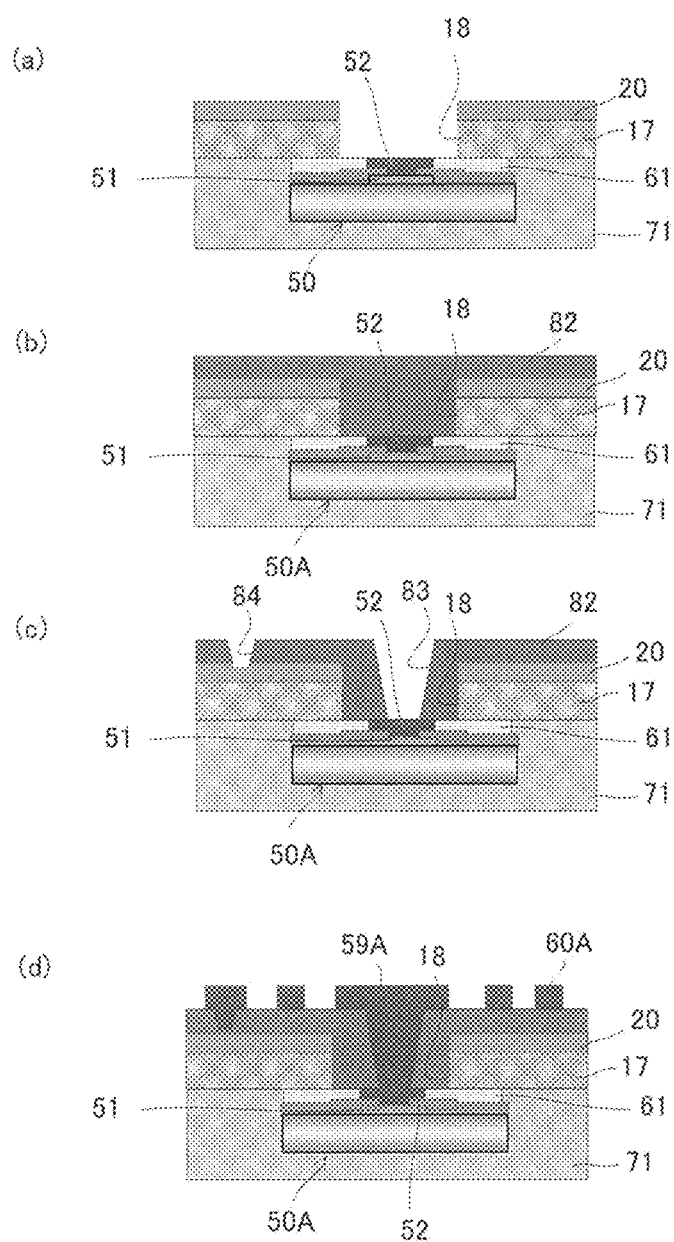
FIG. 32 A sectional view showing a modification of the semiconductor chip-mounted component product of the present invention.

Next will be described another exemplary process for mounting a semiconductor chip on the via wiring formation substrate 1D with reference to FIG. 32. This process includes the same steps as those described in Modification 3 of Component Mounting Embodiment with reference to FIGS. 29(a) to 29(d). Thus, subsequent steps will be described.

Firstly, as shown in FIG. 32(a), a semiconductor chip 50 is mounted, and the support substrate 11 is removed. Thereafter, the via wiring formation via 18 and the metal layer 14 are embedded with an insulating material used for, for example, a re-wiring layer, to thereby form an insulating layer 82 (FIG. 32(b)). Then, a through hole 83 is provided so as to expose the copper PAD 52 of the semiconductor chip 50A, and a through hole 84 is provided so as to expose a desired portion of the metal layer 14 (FIG. 32(c)). These through holes 83 and 84 may be provided through light exposure and development steps of a photolithography process in the case where the insulating material is a photosensitive resin (e.g., photosensitive polyimide). Alternatively, these through holes 83 and 84 may be provided through laser machining in the case where the insulating material is a thermosetting resin. Subsequently, the through holes 83 and 84 are embedded by, for example, the method described above with reference to FIG. 30, and a copper wiring layer provided so as to cover the insulating layer 82 is subjected to patterning, to thereby form a via wiring 59A and a wiring 60A (FIG. 32(d)). The method for forming the via wiring 59A and the wiring 60A is not limited to the aforementioned one, and they may be formed by the method shown in FIG. 31 or may be formed from a copper paste.

The effects achieved by the present embodiment are similar to those described above.

Other Embodiments

The via wiring formation substrate of the present invention is not necessarily produced through any of the aforementioned production processes, and may be produced through another production process.

For example, the metal column 27 is formed through the process shown in FIGS. 6(d) to 6(f) at photolithography-level accuracy in order to provide the via wiring formation via 18 as shown in FIG. 6(i). However, so long as a resin column (in place of the metal column 127) can be formed at high accuracy from a photosensitive resin capable of being embedded in the insulating layer 17 and selectively removed therefrom, the resin column may be directly formed through photolithography, and then a via wiring formation substrate may be produced through the process shown in FIGS. 6(g) to 6(i). Examples of the photosensitive resin that can be used in such a process include photosensitive silicone resin and photosensitive acrylic resin.

DESCRIPTION OF REFERENCE NUMERALS 1, 1A via wiring formation substrate
11 support substrate
12 releasable adhesive layer
13, 28 first insulating layer
14, 31 second insulating layer
15, 15A, 15B via wiring formation via
27 metal column
28 mold resin
50 semiconductor chip
51 aluminum PAD
52 copper PAD
61 adhesive layer
41 mold resin layer
70, 70A, 70B, 80, 80A to 80D re-wiring layer
81, 81A to 81D insulating layer for re-wiring

The invention claimed is:

1. A via wiring formation substrate for mounting at least one semiconductor chip, the via wiring formation substrate comprising
a support substrate,
a releasable adhesive layer provided on the support substrate,
a first insulating layer provided on the releasable adhesive layer, and
a second insulating layer laminated on the first insulating layer,
wherein the first insulating layer and the second insulating layer are provided with a plurality of via wiring formation vias, the via wiring formation vias enabling formation of via wirings which respectively correspond to a plurality of connection terminals of the semiconductor chip and which respectively are configured to connect the plurality of connection terminals, such that the via wiring formation vias penetrate only through the first insulating layer and the second insulating layer without misalignment; and
the total thickness of the first insulating layer and the second insulating layer is selected from a range of 15 µm to 70 µm,
the second insulating layer is configured to be brought into direct contact with an active surface of a semiconductor chip to be mounted, and
the via wiring formation vias are straight vias having a diameter of 15 µm to 70 µm and positional accuracies of ±5 µm or less.

2. The via wiring formation substrate according to claim 1, wherein the second insulating layer is formed of a low-flowability adhesive.

3. The via wiring formation substrate according to claim 1, wherein the first insulating layer is formed of an epoxy sealing material.

4. A semiconductor device-mounted component product comprising
a component-receiving laminate which includes a first layer formed of a first insulating layer and a second layer laminated on the first layer, wherein the first layer and the second layer are provided with via wiring formation vias such that the vias penetrate only through the first and second layers without misalignment;
at least one component which is bonded to the first layer or the second layer of the component-receiving laminate and which has connection terminals oppositely facing the via wiring formation vias;
a third layer which is formed of a mold resin and in which the component is embedded; and
via wirings in which one ends are connected to the connection terminals of the component and the other ends are extracted to the opposite side of the third layer of the component-receiving laminate through the via wiring formation vias;
wherein the total thickness of the first layer and the second layer of the component-receiving laminate is selected from a range of 15 µm to 70 µm,
the via wiring formation vias enabling formation of the via wirings which respectively correspond to the connection terminals of the component,
the via wiring formation vias are straight vias having respectively diameters of 15 µm to 70 µm and has positional accuracies of +5 µm or less, and diameters of the via wiring formation vias are respectively larger than the size of the connection terminals of the component, which oppositely faces the via wiring formation vias respectively; and
the first layer or the second layer of the component-receiving laminate is brought into direct contact with the active surface respectively around the connection terminals of the component.

5. The semiconductor device-mounted component product according to claim 4, wherein the first insulating layer of the first layer is formed of an epoxy sealing material.

6. The semiconductor device-mounted component product according to claim 4, wherein the component comprises at least one semiconductor chip having connection terminals, and at least one semiconductor chip or passive component having a height, or a size in the thickness direction different from that of the semiconductor chip and that of the component-receiving laminate.

7. The semiconductor device-mounted component product according to claim 4, wherein the second layer is formed of a second insulating layer, and the component is bonded to the second layer.

8. The semiconductor device-mounted component product according to claim 7,
wherein re-wiring insulating layers are respectively provided in the via wiring formation vias, through holes are provided in each re-wiring insulating layer, and the via wirings are extracted from the connection terminals of the component to the opposite side of the component-receiving laminate through the through holes.

9. The semiconductor device-mounted component product according to claim 7,
wherein the second layer is formed of a low-flowability adhesive.

10. The semiconductor device-mounted component product according to claim 4,
wherein the second layer is formed of a metal layer; the component is bonded to the first layer;
re-wiring insulating layers are respectively provided in the via wiring formation vias, through holes are provided in each re-wiring insulating layer, and the via wirings are extracted from the connection terminals of the component through the through holes; and
second through holes are provided in the insulating layer for re-wiring and the first layer for exposing the metal layer; and second wirings connecting to the metal layer are provided in the second through holes.

11. The semiconductor device-mounted component product according to claim 10,
wherein the metal layer is a copper foil.

12. The semiconductor device-mounted component product according to claim 4,
wherein the connection terminals of the component are disposed in a one-by-one mode with respect to the via wiring formation vias; a photosensitive resin layer is formed for embedding the via wirings provided through the via wiring formation vias; the photosensitive resin layer is provided with through holes which oppositely face the via wirings; and a wiring layer is provided on the photosensitive resin layer, the wiring layer including second via wirings formed in the through holes connecting to the via wirings.

13. The semiconductor device-mounted component product according to claim 4,
wherein a plurality of connection terminals of the component are disposed with respect to one of the via wiring formation vias in which the photosensitive resin layer is provided; the plurality of through holes which oppositely face the plurality of connection terminals are provided in the photosensitive resin layer; and each through hole is provided with the via wirings.

14. The semiconductor device-mounted component product according to claim 13,
wherein the component is an area pad-type semiconductor chip in which a plurality of connection terminals are disposed in a predetermined area at a central part; the via wiring formation vias are provided in a shape adapted to the predetermined area; the photosensitive resin layer is formed so as to embed the via wiring formation vias; the plurality of through holes oppositely facing the plurality of connection terminals are provided; and each through hole is provided with the via wirings.

15. The semiconductor device-mounted component product according to claim 13,
wherein the component is a peripheral pad-type semiconductor chip in which a plurality of connection terminals are disposed in a predetermined peripheral area surrounding a central part; the via wiring formation vias are provided in a shape adapted to the predetermined peripheral area surrounding the central part; the photosensitive resin layer is formed so as to embed the via wiring formation vias;
the plurality of through holes oppositely facing the plurality of connection terminals are provided; and each through hole is provided with the via wirings.

16. The semiconductor device-mounted component product according to claim 4,
wherein the component product is provided with a re-wiring layer in which re-wirings are formed on the surface where the via wirings are extracted, by the mediation of the photosensitive resin layer.

17. The semiconductor device-mounted component product according to claim 16,
wherein three or more layers of the re-wiring layers are provided.

18. The semiconductor device-mounted component product according to claim 16,
wherein two or three layers of the re-wiring layers are provided; the component-receiving laminate is further provided thereon; and a re-wiring layer is further provided thereon.

19. The semiconductor device-mounted component product according to claim 16, wherein the component further includes the component-receiving laminate on the top re-wiring layer.

20. The semiconductor device-mounted component product according to claim 13,
wherein the component has an eWLP structure in which a semiconductor chip is provided with two or three layers of the re-wiring layers.

21. A via wiring formation substrate for mounting at least one semiconductor chip,
the via wiring formation substrate comprising a support substrate, a releasable adhesive layer provided on the support substrate, and an insulating layer provided on the releasable adhesive layer,
wherein the insulating layer is provided with a plurality of via wiring formation vias provided in the insulating layer, the via wiring formation vias enabling formation of via wirings which respectively correspond to a plurality of connection terminals of the semiconductor chip to be mounted and which respectively connect the plurality of connection terminals, such that the via wiring formation vias penetrate only through the insulating layer without misalignment,
the insulating layer is configured to be brought into direct contact with an active surface of the semiconductor chip to be mounted, and
the via wiring formation vias are straight vias having respectively diameters of 15 μm to 70 μm and positional accuracies of ±5 μm or less.

* * * * *